US012572773B2

(12) United States Patent
  Koh et al.

(10) Patent No.: US 12,572,773 B2
(45) Date of Patent: Mar. 10, 2026

(54) AGENT INSTANTIATION AND CALIBRATION FOR MULTI- AGENT SIMULATOR PLATFORM

(71) Applicant: AARU, INC., Winnetka, IL (US)

(72) Inventors: Edward Koh, Winnetka, IL (US); Cameron Fink, Winnetka, IL (US); John Kessler, Litchfield, NH (US)

(73) Assignee: AARU, INC., Winnetka, IL (US)

( * ) Notice: Subject to any disclaimer, the term of this patent is extended or adjusted under 35 U.S.C. 154(b) by 0 days.

(21) Appl. No.: 19/233,897

(22) Filed: Jun. 10, 2025

(65) Prior Publication Data

US 2025/0378239 A1 Dec. 11, 2025

Related U.S. Application Data

(60) Provisional application No. 63/746,745, filed on Jan. 17, 2025, provisional application No. 63/658,305, filed on Jun. 10, 2024.

(51) Int. Cl.
  G06N 3/006 (2023.01)
  B60W 60/00 (2020.01)
  G06F 9/451 (2018.01)
  G06F 30/27 (2020.01)
  G06N 3/126 (2023.01)
  (Continued)

(52) U.S. Cl.
  CPC ............. G06N 3/006 (2013.01); G06F 9/451 (2018.02); G06F 30/27 (2020.01); G06N 3/126 (2013.01); G06N 20/00 (2019.01); B60W 60/001 (2020.02); B60W 60/0011 (2020.02); G06N 20/20 (2019.01)

(58) Field of Classification Search
  None
  See application file for complete search history.

(56) References Cited

U.S. PATENT DOCUMENTS 6,741,974 B1 * 5/2004 Harrison ................ G06N 3/126
                                               706/14
7,263,474 B2 * 8/2007 Fables .................... G06N 3/004
                                               463/32
(Continued)

OTHER PUBLICATIONS

Ben Said et al., Agent-based Interaction Analysis of Consumer Behavior, AAMAS '02, Jul. 15-19, 2002, Bologna Italy, downloaded Aug. 14, 2025, https://dl.acm.org/doi/pdf/10.1145/544741. 544787 2002.

(Continued)

*Primary Examiner* — Akash Saxena
(74) *Attorney, Agent, or Firm* — PERKINS COIE LLP

(57) ABSTRACT

A platform for adaptive multi-agent simulation in a virtual world instantiates a set of agents with input traits and executes a simulation session, generating an output set. Upon detecting a change event in the virtual world, a trained model recommends an evolution operation, which is applied to the set of agents to generate an evolved set. The evolution operation includes mutation, selection, crossover, deletion of agents, or a combination thereof. The platform persists at least a portion of the initial output set and executes a second simulation operation using the evolved agents, generating a new output set and thereby enabling analysis and comparison of simulation results. The disclosed adaptive simulation approach with persisted context enables realistic and dynamic modeling of complex systems.

20 Claims, 22 Drawing Sheets

(51) Int. Cl.
  *G06N 20/00* (2019.01)
  *G06N 20/20* (2019.01)

(56) References Cited

U.S. PATENT DOCUMENTS

| | | | | |
|---|---|---|---|---|
| 11,188,809 B2 * | 11/2021 | Herzig | .................... | G06N 5/04 |
| 11,551,165 B1 * | 1/2023 | Reynders, III | ......... | G06N 3/006 |
| 12,217,174 B2 * | 2/2025 | Gurumurthy | ............ | G06N 3/08 |
| 2004/0181376 A1 * | 9/2004 | Fables | .................... | G06N 3/004 |
| | | | | 703/6 |
| 2006/0020565 A1 * | 1/2006 | Rzevski | ............... | G06F 9/5027 |
| | | | | 706/50 |
| 2015/0106308 A1 * | 4/2015 | Harrison | ................ | G06N 5/043 |
| | | | | 706/12 |
| 2018/0300598 A1 * | 10/2018 | Crabtree | ............... | G06N 20/00 |
| 2018/0336045 A1 * | 11/2018 | Badr | ...................... | G06N 20/00 |
| 2020/0110416 A1 * | 4/2020 | Hong | ..................... | G06N 20/00 |
| 2021/0104171 A1 * | 4/2021 | White | .................... | G06F 30/20 |
| 2021/0304018 A1 * | 9/2021 | Usman | ................ | G06F 11/3409 |
| 2022/0230194 A1 | 7/2022 | Reynolds et al. | | |
| 2022/0366235 A1 * | 11/2022 | Cassirer | .............. | G06N 3/0495 |
| 2023/0042431 A1 * | 2/2023 | Ramamoorthy | ........ | G06F 17/18 |
| 2023/0316131 A1 * | 10/2023 | Vandikas | .............. | H04W 24/02 |
| | | | | 706/12 |
| 2024/0043034 A1 * | 2/2024 | Johnson | .......... | B60W 60/00272 |
| 2024/0184948 A1 * | 6/2024 | Shu | ......................... | G06F 30/15 |
| 2024/0217548 A1 * | 7/2024 | Pronovost | ......... | B60W 50/0097 |
| 2024/0303501 A1 * | 9/2024 | Zhang | ................... | G06N 3/006 |
| 2024/0418515 A1 | 12/2024 | Wu et al. | | |
| 2025/0165678 A1 * | 5/2025 | Low | ........................ | G06F 30/27 |
| 2025/0378238 A1 * | 12/2025 | Koh | ....................... | G06N 3/006 |
| 2025/0378239 A1 * | 12/2025 | Koh | ....................... | G06N 3/006 |
| 2025/0378301 A1 * | 12/2025 | Koh | ....................... | G06N 3/006 |
| 2025/0378382 A1 * | 12/2025 | Koh | ....................... | G06N 3/006 |
| 2025/0378383 A1 * | 12/2025 | Koh | ....................... | G06N 3/006 |
| 2025/0378384 A1 * | 12/2025 | Koh | ....................... | G06N 3/006 |
| 2025/0378385 A1 * | 12/2025 | Koh | ....................... | G06N 3/006 |

OTHER PUBLICATIONS

Togan et al., An improved genetic algorithm with initial population strategy and self-adaptive member grouping, 2007, Computers and Structures 86 (2008) pp. 1204-1218, https://www.sciencedirect.com/science/article/pii/S004579490700301X (2007).

* cited by examiner

190

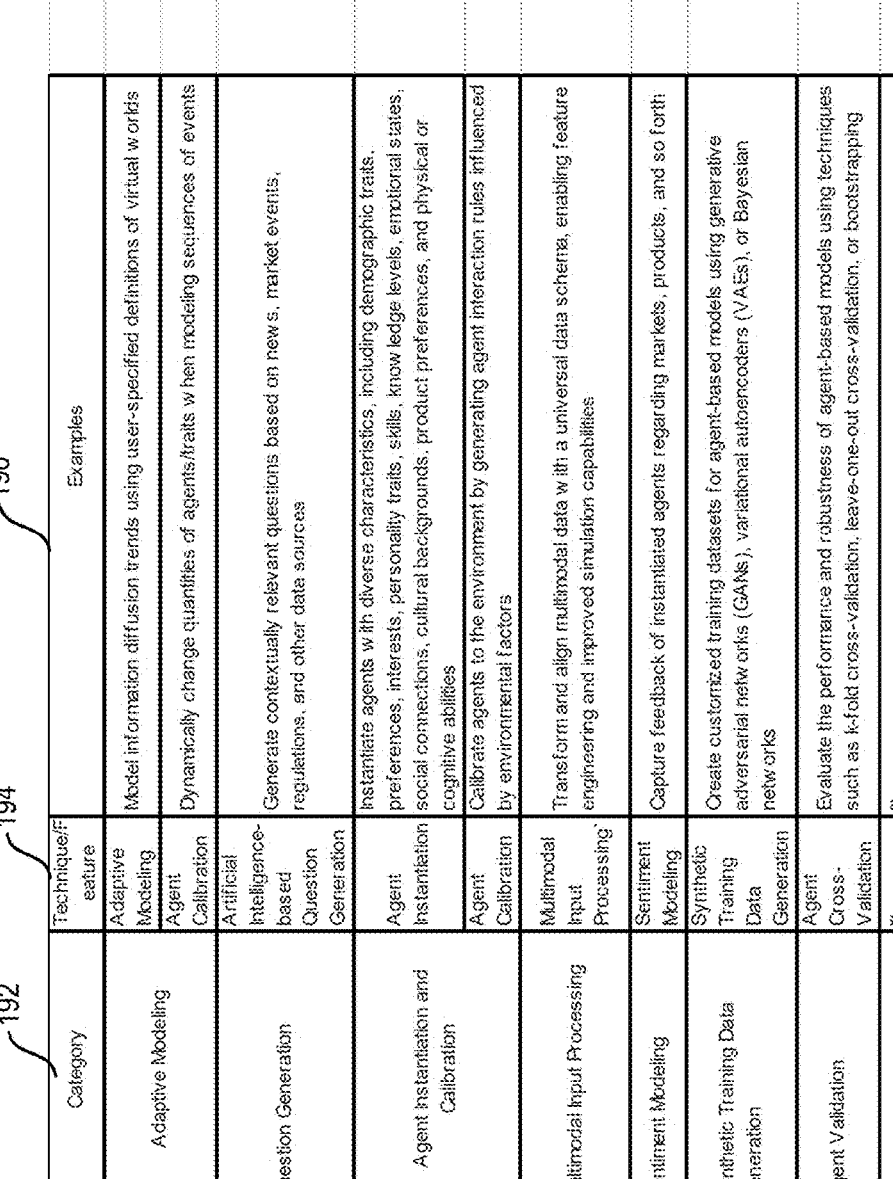

| Category | Technique/Feature | Examples |
|---|---|---|
| Adaptive Modeling | Adaptive Modeling | Model information diffusion trends using user-specified definitions of virtual worlds |
| | Agent Calibration | Dynamically change quantities of agents/traits when modeling sequences of events |
| Question Generation | Artificial Intelligence-based Question Generation | Generate contextually relevant questions based on news, market events, regulations, and other data sources |
| Agent Instantiation and Calibration | Agent Instantiation | Instantiate agents with diverse characteristics, including demographic traits, preferences, interests, personality traits, skills, knowledge levels, emotional states, social connections, cultural backgrounds, product preferences, and physical or cognitive abilities |
| | Agent Calibration | Calibrate agents to the environment by generating agent interaction rules influenced by environmental factors |
| Multimodal Input Processing | Multimodal Input Processing | Transform and align multimodal data with a universal data schema, enabling feature engineering and improved simulation capabilities |
| Sentiment Modeling | Sentiment Modeling | Capture feedback of instantiated agents regarding markets, products, and so forth |
| Synthetic Training Data Generation | Synthetic Training Data Generation | Create customized training datasets for agent-based models using generative adversarial networks (GANs), variational autoencoders (VAEs), or Bayesian networks |
| Agent Validation | Agent Cross-Validation | Evaluate the performance and robustness of agent-based models using techniques such as k-fold cross-validation, leave-one-out cross-validation, or bootstrapping |

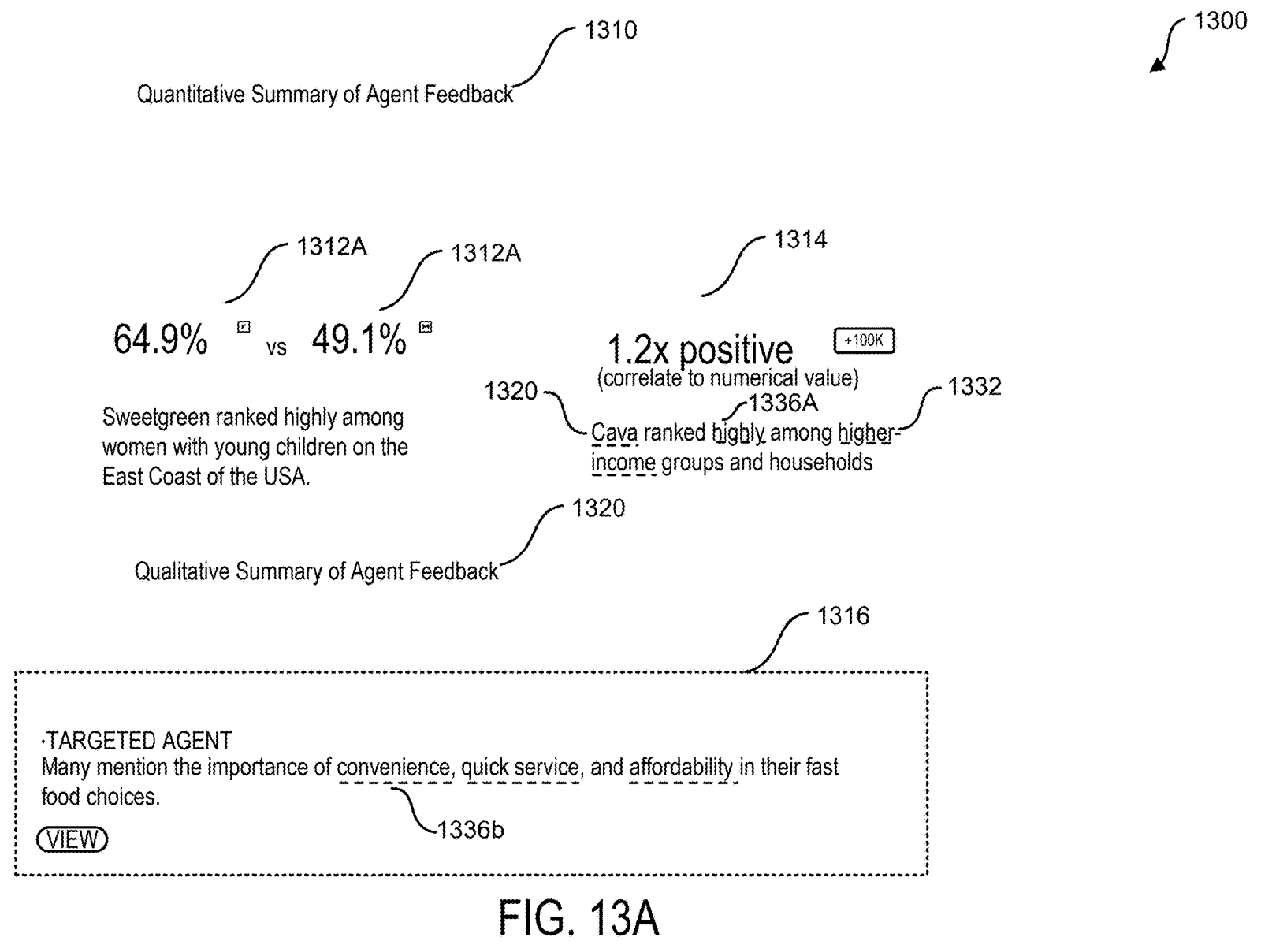

Quantitative Summary of Agent Feedback
1310

1312A    1312A
1314

64.9% ⊡  vs  49.1% ⊠

1.2x positive   +100K
1332
(correlate to numerical value)
1336A

Sweetgreen ranked highly among
women with young children on the
East Coast of the USA.
1320

Cava ranked highly among higher-
income groups and households
1320

Qualitative Summary of Agent Feedback

1316

·TARGETED AGENT
Many mention the importance of convenience, quick service, and affordability in their fast
food choices.
1336b

VIEW

FIG. 13A

Composite Summary of Agent feedback 1.2x positive 64.9% ⊡ vs 49.1% ⊡

Cava ranked highly among higher-income groups and households

Sweetgreen ranked highly among women with young children on the East Coast of the USA.

The word "fresh" and "bright" came up more than most adjectives. They came up the most is reference to chipotle and Sweetgreen

1330

1340

"fresh"

"bright"

"tasty"

1344

1342

1350

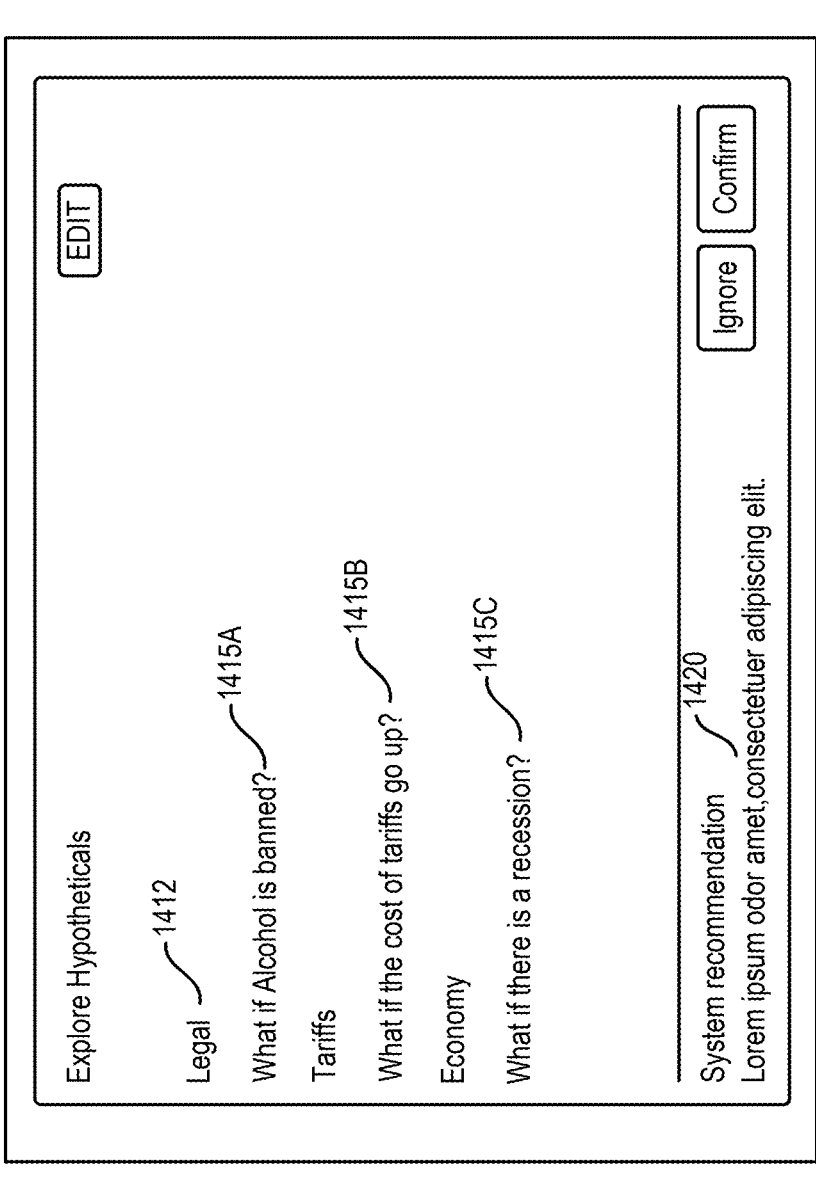
Explore Hypotheticals
Legal ⌐1412
What if Alcohol is banned? ⌐1415A
Tariffs
What if the cost of tariffs go up? ⌐1415B
Economy
What if there is a recession? ⌐1415C
System recommendation ⌐1420
Lorem ipsum odor amet, consectetuer adipiscing elit.
EDIT
Ignore    Confirm
FIG. 14

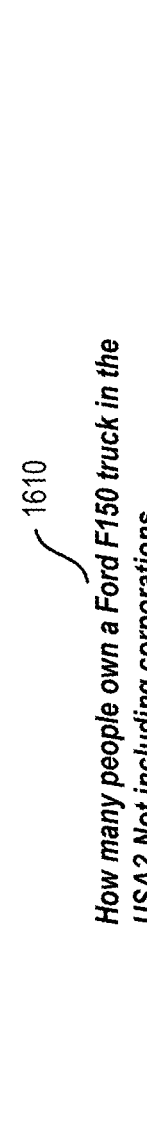

1600

1610

*How many people own a Ford F150 truck in the USA? Not including corporations.*

Estimating Individual Owners of Ford F-150 Trucks in the USA:

Step 1: Total Trucks on the Road 1622A

1620
- Ford F-Series: About 16.1 million currently registered in the U.S. (2021 data). 1622B
- Ford F-150: Typically makes up 70-80% of the F-Series.
  → Estimated F-150s: approximately 12 million vehicles on U.S. roads.

Step 2: Ownership Breakdown

1620
- Fleet Sales: Approximately 15-30% of truck sales are fleet or commercial sales. Estimating 20% specifically for the F-150 is reasonable.
- Therefore, ~80% are individually owned (personal use).

Adjusted Estimated for Individual Ownership:

1630A
- 80% of 12 million = approximately 9.6 million individually owned F-150 trucks.

Step 3: Adjusting for Multiple Truck Ownership

1630B
- About 25% of U.S. households (130 million total) own at least one pickup truck (~32.5 million households)
- Some households own multiple trucks: thus, unique individual ownership will be lower than total individually owned trucks.
- A reasonable estimate, accounting for multiple ownership, is roughly 8 to 9 million unique individual owners.

Final Estimate:

1640
- Approximately 8-9 million unique individual owners of Ford F-150 trucks currently in the USA.

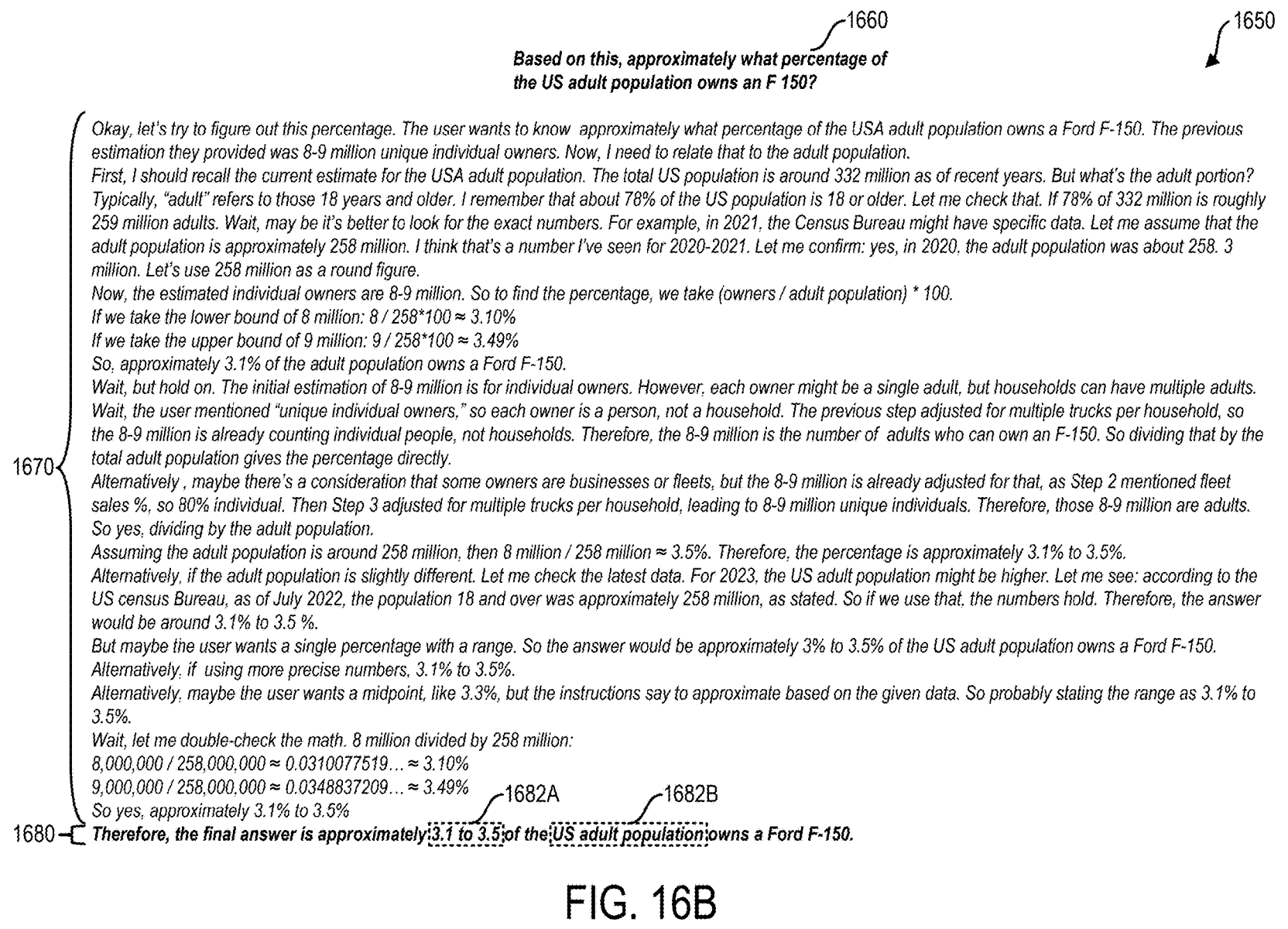

Based on this, approximately what percentage of the US adult population owns an F 150?

1670

*Okay, let's try to figure out this percentage. The user wants to know approximately what percentage of the USA adult population owns a Ford F-150. The previous estimation they provided was 8-9 million unique individual owners. Now, I need to relate that to the adult population.*

*First, I should recall the current estimate for the USA adult population. The total US population is around 332 million as of recent years. But what's the adult portion? Typically, "adult" refers to those 18 years and older. I remember that about 78% of the US population is 18 or older. Let me check that. If 78% of 332 million is roughly 259 million adults. Wait, may be it's better to look for the exact numbers. For example, in 2021, the Census Bureau might have specific data. Let me assume that the adult population is approximately 258 million. I think that's a number I've seen for 2020-2021. Let me confirm: yes, in 2020, the adult population was about 258. 3 million. Let's use 258 million as a round figure.*

*Now, the estimated individual owners are 8-9 million. So to find the percentage, we take (owners / adult population) * 100.*

*If we take the lower bound of 8 million: 8 / 258*100 ≈ 3.10%*

*If we take the upper bound of 9 million: 9 / 258*100 ≈ 3.49%*

*So, approximately 3.1% of the adult population owns a Ford F-150.*

*Wait, but hold on. The initial estimation of 8-9 million is for individual owners. However, each owner might be a single adult, but households can have multiple adults. Wait, the user mentioned "unique individual owners," so each owner is a person, not a household. The previous step adjusted for multiple trucks per household, so the 8-9 million is the number of adults who can own an F-150. So dividing that by the total adult population gives the percentage directly.*

*Alternatively, maybe there's a consideration that some owners are businesses or fleets, but the 8-9 million is already adjusted for that, as Step 2 mentioned fleet sales %, so 80% individual. Then Step 3 adjusted for multiple trucks per household, leading to 8-9 million unique individuals. Therefore, those 8-9 million are adults. So yes, dividing by the adult population.*

*Assuming the adult population is around 258 million, then 8 million / 258 million ≈ 3.5%. Therefore, the percentage is approximately 3.1% to 3.5%.*

*Alternatively, if the adult population is slightly different. Let me check the latest data. For 2023, the US adult population might be higher. Let me see: according to the US census Bureau, as of July 2022, the population 18 and over was approximately 258 million, as stated. So if we use that, the numbers hold. Therefore, the answer would be around 3.1% to 3.5 %.*

*But maybe the user wants a single percentage with a range. So the answer would be approximately 3% to 3.5% of the US adult population owns a Ford F-150.*

*Alternatively, if using more precise numbers, 3.1% to 3.5%.*

*Alternatively, maybe the user wants a midpoint, like 3.3%, but the instructions say to approximate based on the given data. So probably stating the range as 3.1% to 3.5%.*

*Wait, let me double-check the math. 8 million divided by 258 million:*

*8,000,000 / 258,000,000 ≈ 0.0310077519... ≈ 3.10%* — 1682A

*9,000,000 / 258,000,000 ≈ 0.0348837209... ≈ 3.49%* — 1682B

*So yes, approximately 3.1% to 3.5%*

1680 — *Therefore, the final answer is approximately 3.1 to 3.5 of the US adult population owns a Ford F-150.*

FIG. 16B

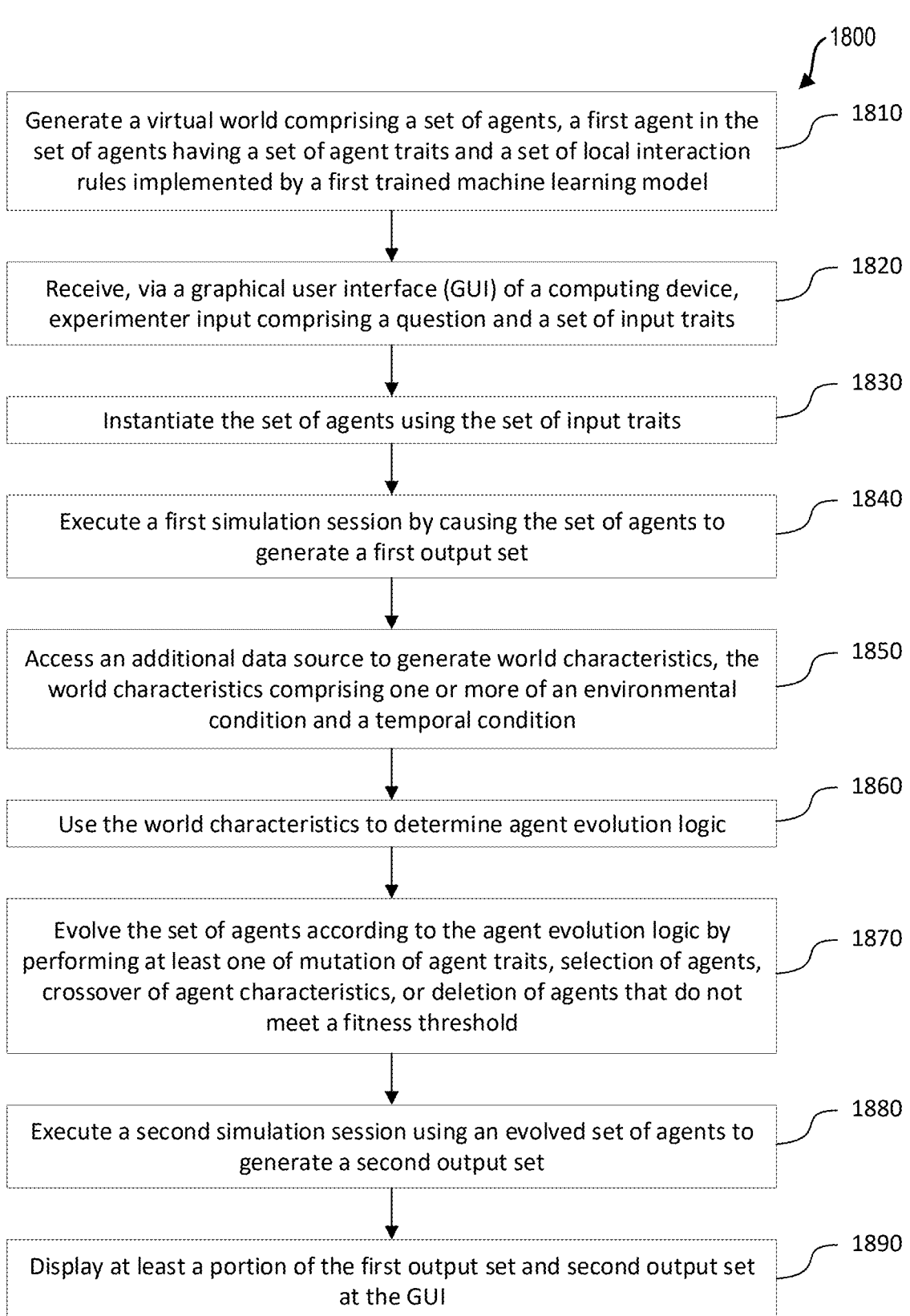

1800

Generate a virtual world comprising a set of agents, a first agent in the set of agents having a set of agent traits and a set of local interaction rules implemented by a first trained machine learning model — 1810

Receive, via a graphical user interface (GUI) of a computing device, experimenter input comprising a question and a set of input traits — 1820

Instantiate the set of agents using the set of input traits — 1830

Execute a first simulation session by causing the set of agents to generate a first output set — 1840

Access an additional data source to generate world characteristics, the world characteristics comprising one or more of an environmental condition and a temporal condition — 1850

Use the world characteristics to determine agent evolution logic — 1860

Evolve the set of agents according to the agent evolution logic by performing at least one of mutation of agent traits, selection of agents, crossover of agent characteristics, or deletion of agents that do not meet a fitness threshold — 1870

Execute a second simulation session using an evolved set of agents to generate a second output set — 1880

Display at least a portion of the first output set and second output set at the GUI — 1890

FIG. 18

AGENT INSTANTIATION AND CALIBRATION FOR MULTI- AGENT SIMULATOR PLATFORM

CROSS-REFERENCE TO RELATED APPLICATIONS

This application claims the benefit of U.S. Provisional Application Nos. 63/658,305 filed Jun. 10, 2024, and 63/746,745 filed Jan. 17, 2025, which are incorporated in their entireties and for all purposes. This application is related to U.S. patent application Ser. No. 19/233,125 filed Jun. 10, 2025 and titled MULTI-AGENT SIMULATOR PLATFORM. This application is related to U.S. patent application Ser. No. 19/233,772 filed Jun. 10, 2025 and titled AGENT TRAIT DIFFUSION SIMULATION TECH-NIQUES FOR MULTI-AGENT SIMULATOR PLAT-FORM. This application is related to U.S. patent application Ser. No. 19/234,101 filed Jun. 10, 2025 and titled Ser. No. 19/233,772 filed Jun. 10, 2025 and titled AGENT TRAIT DIFFUSION SIMULATION TECHNIQUES FOR MULTI-AGENT SIMULATOR PLATFORM. This application is related to U.S. patent application Ser. No. 19/233,897 filed Jun. 10, 2025 and titled AGENT INSTANTIATION AND CALIBRATION FOR MULTI-AGENT SIMULATOR PLATFORM. This application is related to U.S. patent application Ser. No. 19/233,962 filed Jun. 10, 2025 and titled AGENT QUERY TECHNIQUES FOR MULTI-AGENT SIMULATOR PLATFORM. This application is related to U.S. patent application Ser. No. 19/234,043 filed Jun. 10, 2025 and titled AGENT-BASED MODELER USING MUL-TIMODAL INPUT PROCESSING AND ATTRIBUTE EXTRACTION. This application is related to U.S. patent application Ser. No. 19/234,079 filed Jun. 10, 2025 and titled AGENT-BASED MODELER USING MULTIMODAL INPUT. The content of the foregoing applications is incor-porated herein in its entirety by reference.

TECHNICAL FIELD

The systems, methods, and computer-readable media dis-closed herein relate generally to generative social science and include computer-based multi-agent simulation tech-niques.

BACKGROUND

In computational organizational science, the subfield of social simulation explores the simulation of societies (groups of entities or individuals) as complex non-linear systems, which can be difficult to study with classical mathematical equation-based models. Historically, social simulation techniques relied primarily on the descriptive approach, which made use cases difficult to generalize. A subsequent generation of social simulation techniques intro-duced a formal approach similar to that used in the natural sciences. However, a purely quantitative (formal) approach makes it difficult to capture intangibles that affect the behavior of individuals or entities, such as social norms, opinions, preferences, individual histories, biases, environ-mental trends, environmental conditions, and other factors. Conventional approaches also make it difficult to eliminate selection bias and other types of bias in selecting model inputs, which can produce inaccurate simulation outcomes. Additionally, conventional approaches make it difficult to generate complex, chain-of-thought simulations and trace cause-and-effect links between inputs and outputs of such simulations. Furthermore, conventional approaches make it difficult to adapt simulations to changing world conditions.

BRIEF DESCRIPTION OF THE DRAWINGS

FIG. 1B illustrates example use cases enabled by the multi-agent simulator platform, in accordance with some implementations of the present technology.

FIGS. 8-14 are example graphical user interfaces (GUIs) illustrating features of the multi-agent simulator platform, according to some arrangements.

FIGS. 16A and 16B are diagrams illustrating example reasoning operations to implement the diffusion simulation techniques, according to some arrangements.

FIG. 18 is an example flowchart showing scenario simu-lation operations of the multi-agent simulator platform, according to some arrangements.

Figure 1A:
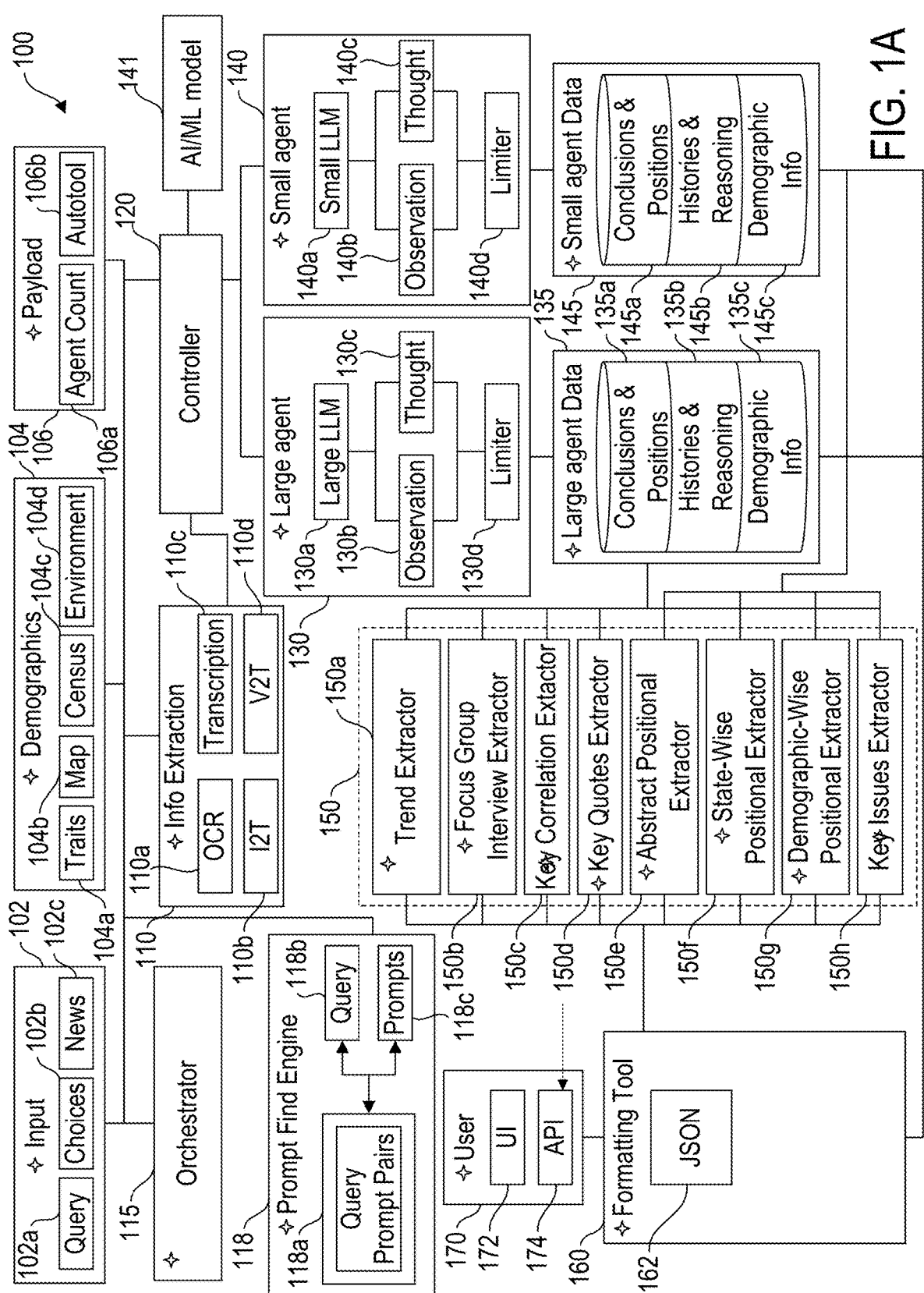
FIG. 1A shows an example computing environment that illustrates aspects of an orchestration engine for a multi-agent simulator platform, in accordance with some imple-mentations of the present technology.

The drawings have not necessarily been drawn to scale. For example, some components and/or operations may be separated into different blocks or combined into a single block for the purposes of discussion of some of the embodi-ments of the disclosed system. Moreover, while the tech-nology is amenable to various modifications and alternative forms, specific embodiments have been shown by way of example in the drawings and are described in detail below. The intention, however, is not to limit the technology to the particular embodiments described. On the contrary, the technology is intended to cover all modifications, equiva-lents and alternatives falling within the scope of the tech-nology as defined by the appended claims.

DETAILED DESCRIPTION

Overview of the Multi-Agent Simulator Platform

Disclosed herein are computer-implemented multi-agent simulator platforms and methods that enable simulation of complex virtual worlds and analysis of the behavior of agents within those worlds. The virtual worlds can be representative of physical worlds, such as communities, business environments, companies or markets, which are normally difficult to capture in computer-based simulations due to complex agent interactions and changing environmental conditions.

According to various use cases, the platform can generate computer-based simulations of agent behavior in various fields including cybersecurity, system architectures, urban planning, economics, sociology, and epidemiology. For instance, the platform can be used to model complex interactions between various components of a distributed network (e.g., in response to one or more cybersecurity vulnerabilities or attacks). In some implementations, the platform models the impact of a new transportation system on motorist behavior and traffic patterns. In another example, the platform can be used to study the effects of policy changes on market behavior. The platform can also be used to model the behavior of larger populations, allowing for the study of the spread of diseases, the impact of social movements, and the like. By providing a virtual sandbox for testing and experimentation, the platform provides a robust tool for understanding and predicting the behavior of complex systems.

In various example implementations, the platform receives or generates virtual world questions (queries) and hypotheses and uses these items to generate simulation contexts and instantiate sets of agents with particular traits (e.g., attributes, features) and behaviors. The platform enables computer-based operations to evolve agents across simulation sessions within a particular context (e.g., based on changing world conditions and/or hypotheses in a question chain), allowing the agents to adapt and respond to dynamic environmental and temporal conditions. For example, a simulation context may involve a new product launch, and the platform may instantiate agents that respond to marketing messages, interact with peers, and update their purchasing intentions accordingly. This enables experimenters (platform users) to test hypotheses and explore scenarios in a realistic and dynamic manner and provides a more accurate and robust understanding of complex systems and behaviors.

The disclosed platform offers technical benefits that enhance the accuracy, reliability, and efficiency of simulations. In some implementations, the platform's virtual world modeling capabilities facilitate the creation of complex contextual frameworks, enabling agents to engage in sophisticated chain-of-thought reasoning. The agent evolution mechanism allows agents to adapt and evolve over time, leading to improved fitness and performance. Conditional agent spawning enables the dynamic creation of new agents based on specific conditions or events, improving the scalability and flexibility of simulations. In some implementations, sentiment analysis extracts qualitative insights from agent-generated feedback, providing a more nuanced understanding of agent behavior. The platform's explainability and transparency mechanisms provide metrics that can be used in agent evolution logic, such as R-squared values, mean squared error, and F1 scores, facilitating the evaluation of agent performance and reliability. Incremental learning enables models to learn from feedback data and adapt over time, including changing physical structures of the models. The platform's support for various machine learning paradigms, including reinforcement learning, federated learning, and transfer learning, enables the emergence of complex behaviors and improves overall system performance.

These example technical benefits are discussed in more detail throughout the document, with some features highlighted below.

In some implementations, the platform's virtual world modeling capability facilitates the creation of complex contextual frameworks, enabling agents to engage in sophisticated chain-of-thought reasoning through dynamically generated question structures. Relevant questions can be generated on-demand to test contextually significant hypotheses by persisting the evolving state of the world, acquiring additional, up-to-date information, such as news articles, and utilizing these data points to generate sets of relevant hypotheses, which can be further tuned by the experimenter. The ability to generate virtual worlds and contextually relevant questions, in turn, enhances the reliability and fidelity of simulations, allowing for more accurate predictions and insights. Accordingly, the platform can simulate complex scenarios, such as cybersecurity threats, supply chain disruptions or economic downturns, and provide agents with contextual information to inform their decision-making.

In some implementations, the platform's agent evolution mechanism can employ a hybrid approach, such as combining elements of evolutionary computation algorithms (e.g., mutation, selection, crossover) with environmental feedback loops using contextual data preserved across simulation sessions. This enables agents to adapt and evolve in response to changing environmental conditions (e.g., changing state of the virtual world), leading to improved fitness and performance of agents in successive simulation sessions. In some implementations, the platform's evolution mechanism can incorporate domain knowledge and/or rules. For example, the mutation logic can utilize domain-specific ontologies, knowledge graphs, fitness scoring repositories, novelty scoring repositories, policy rule repositories, and the like to inform the generation of new agent variants.

The disclosed techniques also enable conditional spawning of agents based on temporal and/or environmental conditions. This approach improves conventional approaches by enabling sophisticated modeling, in virtual environments, of population sampling techniques (e.g., random, stratified, cluster, convenience sampling) and allowing experimenters to quickly scale up experiments where subjects would ordinarily be difficult to find. For example, stratified sampling involves dividing a population into subgroups based on a characteristic and taking random samples from each subgroup. The platform enables the creation of sophisticated, multi-attribute strata in situations where data may not be available due to ethical or participant privacy issues, which enables effective assessment of policy and event impact without incurring real-world harm. It can be difficult to gather a statistically significant sample of responders who fit a multi-attribute strata (i.e. have a particular combination of traits). It is also difficult to scale up the studies to additional similar populations in other segments (e.g., across geographies), and the disclosed techniques solve these problems. For example, a particular sequence of questions can be posed to an instantiated set of agents in a particular simulated geographic location (e.g., a city, a state). If agent feedback, a particular question in the sequence, or changing world conditions call for expanding the audience to a set of target locations (e.g., ten largest cities in the United States, all states in the United States) or for another modification of an initial set of agents, the platform can conditionally spawn sets of agents with specific attributes, eliminate redundant agents, combine agent attributes to generate agents having specific characteristics predicted to have a relatively higher impact on generated agent feedback, and so forth.

For instance, consider a simulation designed to assess the effects of a new tax policy on low-income households. Initially, 1,000 agents representing low-income households in New York City are instantiated with attributes randomly sampled from census data, such as household composition, income level, occupation, education level, and number of dependents. After analyzing agent feedback from the first simulation session, it becomes clear that households with dependents are disproportionately affected by the tax policy. This insight triggers the conditional spawning of a new set of 4,000 agents representing households with dependents in the 10 largest cities in the United States. However, to further refine the simulation, the platform also incorporates a synthetic data attribute representing households with over $10,000 in savings, a data point not publicly available. This synthetic attribute is generated using statistical models and machine learning algorithms, ensuring that the simulated data is realistic and representative of the target population. The updated agent population of 5,000 agents now includes households with dependents and over $10,000 in savings, allowing policymakers to assess the tax policy's impact on this specific subgroup. In the subsequent simulation session, the agents respond to a revised question, taking into account the new tax policy's effects on households with dependents and significant savings. As the simulation progresses, the platform can scale up the study to capture regional differences and other nuances, conditionally spawning additional agents to represent households with dependents and significant savings in all 50 states, ultimately enabling a comprehensive and accurate assessment of the tax policy's impact on this vulnerable population. By scaling up the simulation in this manner, researchers can identify potential hotspots of poverty and economic hardship, and policymakers can develop targeted interventions to mitigate the negative effects of the tax policy.

Furthermore, in computational organizational science, a purely quantitative (formal) approach makes it difficult to capture intangibles that affect the behavior of individuals or entities, such as social norms, opinions, preferences, individual histories, biases, environmental trends, environmental conditions, and other factors. To solve this problem, the disclosed platform's sentiment analysis operations can employ techniques such as natural language processing (NLP) to extract qualitative insights from agent-generated feedback. By generating and analyzing sentiment scores, topic models, and discourse structures, the platform provides a more nuanced understanding of agent behavior and decision-making processes, enabling more informed decision-making and system optimization. Continuing the example above, instantiated agents that represent low-income households with dependents and significant savings can generate qualitative responses (e.g., noting the likely purpose of the savings, such as child care, medical care, and so forth), which can enable policymakers to assess the impact of the proposed tax policy more accurately.

In some implementations, to improve explainability and transparency of its models, the platform provides mechanisms for drilling down into agent behavior and decision-making processes. These mechanisms are enabled by persisting agent and world attributes, state information, and interaction rules across simulation sessions, as discussed throughout this document. By persisting agent state across simulation sessions, the platform enables the computation of metrics such as R-squared values, mean squared error, and F1 scores, which enables agent evolution logic and facilitates the evaluation of agent performance and reliability. These metrics can be computed using various techniques, such as regression analysis or classification metrics, and can be visualized using dashboards, heatmaps and the like to provide insights into agent behavior.

Continuing the above example, when a particular instantiated agent generates a prediction about the impact of the new tax policy on low-income households, the platform can calculate various metrics to evaluate the accuracy of the prediction. For instance, the platform can calculate the R-squared value to measure the goodness of fit between the agent's predicted household income and the actual household income, using the formula: $R^2=1-(SSE/SST)$, where SSE is the sum of squared errors between predicted and actual values, and SST is the total sum of squares. Additionally, the platform can calculate the mean squared error (MSE) to quantify the average difference between predicted and actual household income values. For example, if an agent predicts that a household with dependents and over $10,000 in savings will experience a 10% decrease in income due to the tax policy, and the actual decrease is 12%, historical simulation session data would enable calculation of the MSE to capture this error. The platform could also calculate F1 scores to evaluate the agent's ability to correctly classify households as being disproportionately affected by the tax policy. By analyzing these metrics, researchers and policymakers can refine the simulation and develop more effective interventions to mitigate the negative effects of the tax policy on vulnerable populations.

In some implementations, persisting data about simulation sessions across session iterations also enables providing feedback loops to the models, which can improve models' predictive capabilities via iterative training, reinforcement learning or various other suitable techniques. In other words, the models can adapt to changing data and concepts over time. Data that can be fed back to the models can include virtual world data (e.g., rules, events, attributes, constraints), question data (e.g., question, chain definitions), agent data (e.g., characteristics, states, feedback items, agent interaction rules), and/or context data (e.g., session data, such as state of the world data, agent data, interaction rules, and so forth). This data can be provided to the models along with reference feedback, such as prediction quality metrics, prediction accuracy measures, actual data, ground truth data, and so forth. Actual data/values can be supplied to the platform in the form of reference tables, API feeds, knowledge graphs, or via other suitable techniques. In some implementations, actual data can be replaced or supplemented with model validation data, such as synthetic data, imputed data, expert feedback, benchmarking values, crossvalidation data, proxy metrics, and so forth.

In some implementations, the models can ingest the feedback data and incrementally learn using the feedback data. Incremental learning can include changing physical structures of the models. For example, if a model is a neural network, incremental learning can include adjusting the number of layers (adding or removing layers to adapt to changing data distributions to improve performance), pruning nodes (removing redundant or unnecessary nodes to reduce computational complexity), changing weights (updating the weights of existing connections to reflect changing relationships in the data), changing activation functions (switching to different activation functions to adapt to changing data characteristics to improve performance), adding or removing connections (modifying network topology to reflect new relationships or patterns in the data) and so forth.

More generally, according to various implementations, the platform's agent learning framework can support various machine learning paradigms, including reinforcement learning, federated learning, and transfer learning. By enabling agents to learn from each other and from environmental feedback, the platform facilitates the emergence of complex behaviors and improves overall system performance. The agents can learn from environmental feedback by causing the platform to incrementally train foundation models using simulation session data, such as persisted world, question, and/or agent state data. The agents can also learn from each other by submitting local knowledge to a foundation model for incremental retraining and/or through other methods. For example, the platform can persist agent-level model state (e.g., weights, activation functions, and so forth) and apply a model averaging method or another suitable method to consolidate model knowledge. In some implementations, to minimize propagation of bias throughout the network and enable privacy of simulations, the platform can implement local agent gating functions to assess the quality of local knowledge (e.g., using accuracy metrics such as those described above) before local knowledge is propagated to other agents and/or the foundation model(s).

As used herein, the terms "agent", "local agent", "agent node" and similar terms refer to entities that interact with their environment, process information, and/or take actions to achieve specific goals or objectives, such as the goals or objectives determined based on experimenter questions/queries, and/or inferred from the environment (e.g., by considering the rules, events, attributes, and/or constraints in a virtual world). An agent can be thought of as a combination of software, firmware and/or hardware components that encompass characteristics (e.g., traits, attributes, properties, and/or knowledge), states (e.g., user question or its derivatives, agent feedback), and/or agent interaction rules that govern its behavior and communication with other agents. The agent interaction rules can include references to models (e.g., AI/ML model, such as neural networks) that define agents' decision-making processes and behaviors. Instantiating (spawning) an agent refers to the process of creating a new instance of an agent entity, class or object, which can involve allocating memory for the agent's data structures and variables, initializing agent attributes, setting up agent communication channels, and activating agent reasoning and decision-making mechanisms. This process can be compared to creating a new thread or process in a computer program, where the instantiated agent operates as a separate entity, executing autonomously and interacting with its environment and other agents. Depending on the implementation, agents can take various forms, such as executables running on physical and/or virtual machines and/or robotic agents interacting with physical environments. In some cases, agents can be instantiated as containerized applications, leveraging technologies like Docker, or as serverless functions, utilizing platforms like AWS Lambda. Additionally, agents can be implemented using various programming paradigms, including object-oriented, functional, or logic-based programming, and can be designed to operate in diverse domains, such as e-commerce, healthcare, finance, or transportation.

Agents can use physical or virtualized resources (e.g., elements of FIGS. 2, 3 and/or 4, such as processors, memory, cache, communication interfaces, devices, databases, servers, components of the AI/ML stack) in any suitable combination. Particular ones of such resources can be statically allocated or dynamically allocated at runtime (e.g., to a particular agent or group of agents for a duration of a simulation session or a set of simulation sessions). Particular ones of such resources can be dedicated, shared among agents, or shared between an agent and other processes. Various components of agents (e.g., models, data stores, executables, processors) can be implemented across resources in a distributed manner. Accordingly, unless otherwise indicated by context or expressly noted, the terms "local" (as in "local agent") and "node" (as in "agent node") should not be automatically assumed to refer to a particular unitary physical resource. Agents can generate and/or execute queries, including database queries, API calls, and system-level data requests, to inform their decision-making processes or generate outputs. System-level data requests involve the execution of compiled instructions, such as native code or bytecode, to access low-level system resources, invoke system calls, or perform other operations requiring direct hardware or software interaction. This can include executing shell commands or scripts, accessing system logs or event streams, invoking system APIs or device drivers, and performing system-level monitoring or profiling. By executing these queries, agents can access relevant data from various sources, reason about their environment, and produce more accurate and context-dependent outputs.

The terms "engine", "logic", and like terms should be understood as referring to hardware, firmware, software, and/or combinations thereof, including particularly configured devices structured to perform operations such as the operations described herein in any suitable combination.

The terms "risk," "sentiment", "impression", and like terms should be understood as denoting the computationally inferred risk-related, emotional, attitudinal, or subjective valence associated with a particular entity, concept, or experience, as represented in digital data and interpreted or generated by artificial intelligence systems or other computer-based agents, which can generate sentiment output that approximates human-like response. Sentiment output can include values, scores, tokens (e.g., natural-language qualifiers, such as adverbs and adjectives), or classifications (e.g., positive, negative, neutral) that characterize the emotional tone or attitude conveyed in various forms of data, including text, audio data, speech patterns, video data, facial expression analysis, neural data (e.g., brain activity patterns), and other multimodal inputs, such as acoustic features, linguistic patterns, and behavioral signals.

Various elements of the invention are sometimes described according to groups, implementations, or use cases for brevity. One of skill will appreciate that variations of such combinations are contemplated.

Orchestrator Engine for a Multi-Agent Simulator Platform

FIG. 1 shows an example computing platform 100 that includes an orchestrator engine for multi-agent simulator platform in accordance with some implementations of the present technology. As an overview, the computing platform 100 facilitates orchestration of AI/ML models. The AI/ML models can include neural networks, such as large language models (LLMs), to respond to user queries, prompts and so forth. For instance, various circuits (modules) of the systems described here can include circuits (e.g., application specific integrated circuits (ASIC), engines, logic, executables and the like) that can include a set of neurons and a set of synaptic circuits that link the neurons in a neural network.

The neurons can include, for example, memory units (e.g., registers), processors units (e.g., microprocessors) and/or input gates. The synaptic circuits can include memory units that store synaptic weights. Additionally or alternatively, the AI/ML models can include Generative Adversarial Networks (GANs), Sparce Linear Models (SLMs), and/or Support Vector Machines (SVMs). Instances of neural networks (or other suitable AI/ML models) are trained neural networks that represent agents, which can be instantiated as needed to handle a specific task and/or answer a specific question or set of questions.

A controller and an orchestrator can selectively instantiate and/or turn specific agents on or off based on various factors, such as query complexity, modality of the information analyzed or retrieved, modality of the output, agent count parameters, or other factors. For instance, they can instantiate agents with specialized skills or knowledge to handle complex queries, such as multi-step problems or nuanced decision-making scenarios, based on query complexity. They can also activate agents that can process specific types of data, such as text, images, or audio, to analyze or retrieve information from diverse sources, depending on the modality of the information analyzed or retrieved. Additionally, they can selectively instantiate agents that can generate output in various formats, such as natural language, visualizations, or recommendations, to cater to different user preferences or requirements, based on the modality of the output. Furthermore, they can dynamically adjust the number of agents instantiated based on factors like system load, query volume, or available computational resources, using agent count parameters. Other factors can also be considered, such as contextual information, like user location, time of day, or current events; user preferences, such as language, tone, or level of detail; system performance, to optimize system performance, minimize latency, or reduce computational overhead; and knowledge graph updates, instantiating agents in response to updates in the knowledge graph, ensuring that the system remains up-to-date and accurate.

For example, consider a complex query that asks for a numerical recommendation and a qualitative statement for context: "Given the current global economic uncertainty and rising inflation, what percentage of my portfolio should I allocate to sustainable energy stocks, and how will this impact my long-term investment strategy?" To answer this query, the agent would consider current events, such as the latest inflation rates, economic forecasts, and sustainable energy trends. The agent would employ various techniques, including Retrieval-Augmented Generation (RAG) to access relevant news articles and research papers, knowledge graphs to identify relationships between economic indicators and sustainable energy stocks, and natural language processing (NLP) to analyze market sentiment and trends. By selectively instantiating agents with specialized skills and knowledge, the system can provide a comprehensive and up-to-date response, including a numerical recommendation (e.g., "Allocate 15% of your portfolio to sustainable energy stocks") and a qualitative statement for context (e.g., "This allocation will provide a hedge against inflation and align with your long-term investment strategy, while also supporting the growth of sustainable energy technologies").

In some implementations, agents can be classified as large agents or small agents. In some implementations, large agents can be trained neural networks that can produce output based on qualitative inputs. Small agents can be trained neural networks with architectures sufficient to enable the small agents to process quantitative data. Additionally or alternatively, agents can include additional AI/ML models, such as AI/ML model 141. The controller 120 can selectively determine the quantity of agents to instantiate and can further determine a ratio of small to large agents. For example, N small agents can be instantiated to generate numerical outputs. Sampling techniques can be applied to the population of N small agents to generate N' large agents where the ratio of N':N is in a predetermined range (e.g., between 1:1 and 1:100). In some implementations, N' is less than N. The N' large agents can receive and/or generate qualitative data to provide feedback additional to quantitative data. Utilizing small agents when appropriate enables the technical advantage of conserving computer resources and increasing the speed of execution of neural networks that underlie the agents.

The agents enable complex, reproducible and tunable simulations. The agents can simulate behavior, such as behavior of interviewees in a poll, consumer behavior, environmental conditions, collective behavior of autonomous machines, traffic, and so forth. The agents can be utilized to generate outputs, simulate focus group interviews, generate opinion and/or quote simulations, generate simulations of poll responses, generate simulations of purchasing scenarios, generate simulations of natural phenomena, generate simulations of machine failure and/or interaction, generate simulation of cell interaction in an organism, and so forth. To enable the agents to simulate behavior of entities or individuals with various traits, the agents can be trained using trait data, map (geographical data), census data, and/or additional suitable contextual data, including, without limitation, environmental data, biomedical signal data, medical intervention (treatment) data, human behavior data, machine configurations and feature sets, and so forth. In some implementations, the agents can be used to generate successive ensemble (chain-of-thought) simulations to enable modeling of complex scenarios.

In some implementations, the neural networks of the agents can be implemented as AI/ML systems, not shown here for brevity. In an example implementation, an AI/ML system can include a set of layers, which conceptually organize elements within a topology for the AI/ML system's architecture to implement a particular AI/ML model. In an example AI/ML model, information can pass through each layer of the AI/ML system to generate outputs for the AI/ML model. For example, an AI/ML system that implements a neural network can include a set of nodes that can have activation functions. As the neural network is trained, each node's activation function defines (or adjusts) how to node converts data received to data output. Together, the nodes and their activation function implement an AI/ML algorithm, which can be tuned using model parameters. The model parameters can represent the relationships learned by the neural network during training and can weight and bias the nodes and connections of the model. An example AI/ML stack is discussed in connection with FIG. 4.

In an example implementation of a multi-agent platform, inputs 102 can be used by the orchestrator 115 to select appropriate combinations of large and/or small agents (130 and 140, respectively) to perform a particular task. In some implementations, the selection process can include the use of symbolic logic or rules-based logic, such as if-then statements. In some implementations, the selection process can include applying an AI/ML model 141 (e.g., a trained neural network or another AI/ML model) to the inputs 102 and/or modified inputs 110. To that end, inputs can include queries 102a, choices 102b, news sources 102c or other inputs. The inputs can be processed to generate modified inputs 110. For example, an optical character recognition (OCR) engine 110a can extract textual information from inputs that include images or video frames. In another example, an image-to-text engine 110b can transcribe image context to text. In another example, a transcription engine 110c can extract audio streams from video files and transcribe audio streams to text. In another example, a video-to-text engine 110d can transcribe video content to text (for example, by applying a trained neural network to generate descriptions of frame content in videos). In additional examples, the platform can change input data modalities, image attributes, audio attributes, video attributes, and so forth.

In some implementations, to facilitate gathering of inputs 102 and/or to facilitate generation of modified inputs 110, the platform can employ a prompt find engine 118. The prompt find engine 118 can utilize query stubs 118b and/or prompt stubs 118c to generate query-prompt pairs 118a. The query-prompt pairs 118a can then be executed to acquire inputs using queries 102a. In some implementations, the query-prompt pairs 118a can be utilized to generate parameters that define output domains for queries 102a (for example, by specifying format of content parameters or categorical values for outputs).

The controller 120 can determine, based on the inputs 102 and/or modified inputs 110, which agents should be instantiated. The controller 120 can make this determination using model payload configuration settings managed by the payload engine 106. For example, the payload engine 106 can store configuration information regarding agent count settings 106a and/or thresholds for simulations. In another example, the payload engine 106 can include an autotool 106b, which can be configured to generate an automatic estimate of the correct number of agents to use. The estimate can be based on various suitable factors, which can include keywords, tone, sentiment, and/or domain restrictions determined using the inputs 102 or modified inputs 110.

For example, these factors can be utilized by the controller 120 to determine, in conjunction with the payload engine 106, which agents and/or underlying models have been trained on subsets of demographic training data 104 needed to answer a particular question or perform a task. The demographic training data 104 can include, for example, trait data 104a (distribution of traits or characteristics within a domain), map data 104b (geographical maps having regions corresponding to distributions of traits), and/or census data 104c (trait data mapped to environmental data 104). Environmental data 104 can include any suitable contextual data, such as consumer purchasing history, consumer preferences, issue summaries, geopolitical indicators, economic indicators, weather indicators, traffic patterns, or other data. In some implementations, constraints of a particular virtual world (e.g., policy stores, rule stores, user-supplied trait preferences) can be referenced to generate further restrictions on agent quantities, types, traits, models to use, and so forth.

The large agents 130 and small agents 140 each include suitable trained neural networks (130a, 140a), such as LLMs. Large agents 130 can include neural networks with a comparatively higher number of nodes and/or layers (e.g., Mixtral™, 176B, Claude 3 Sonnet™, GPT-4-Turbo™, Gemini 1.5 Pro or another suitable neural network that has characteristics suitable for implementation as a large agent 130 (size, number of inputs, context window, tuning parameters, output token window, or other characteristics)). Small agents 140 can include neural networks with a comparatively smaller number of nodes and/or layers (e.g., Mixtral™ 46.7B, Claude 3 Haiku™, GPT-3.5-Turbo™, Gemini 1.0

Pro or another suitable neural network that has characteristics suitable for implementation as a small agent 140). The techniques disclosed herein can be implemented via multiple different large models, multiple different small models, a mix of both, or a singular large or small model.

In some examples, the trained neural networks (130a, 140a) can apply reasoning algorithms (130c, 140c) and/or limiters (130d, 140d) to sets of observations (130b, 140b). Observations are input features generated using the inputs 102 and/or modified inputs 110. The trained neural networks (130a, 140a) can generate outputs (135, 145), which can include, for example, conclusions and positions (135a, 145a), histories and reasoning (135b, 145b), and/or demographic information (135c, 145c). The outputs (135, 145) can therefore be traced and verified using these items, which improves experimenter ability to derive cause-effect relationships and covariances and to conduct controlled experiments by specifying or modifying characteristics of inputs 102a (by, for example, by adjusting simulation questions or prompts to specify population characteristics with increasing granularity).

The outputs (135, 145) can be utilized by various engines of the extractor 150. For example, a trend extraction engine 150a can automatically determine trends based on output characteristics, such as demographics. The focus group interview engine 150b can enable experimenters to simulate interviews for specific agents (130, 140). The key correlation engine 150c can identify correlations and demographic connections. The key quotes extractor 150d can extract relevant quotes and specific moments from histories and/or conclusions. The abstract positional extractor 150e can extract various positions and thoughts from specific agents (130, 140). The state-wise positional extractor 150f can extract positions and conclusions of agents (130, 140), in a quantifiable manner, in specific geographical areas. The demographic-wise positional extractor 150g can extract positions and conclusions of agents (130, 140), in a quantifiable manner, with respect to demographic characteristics. The key issues extractor 150h can identify the most used terms, topics, and so forth across instantiated agents (130, 140).

The outputs of the extractor 150 can be structured by the formatting tool 160 as key-value pairs 162, in in other suitable forms, for presentation to the user 170 via user interfaces 172 or application programming interfaces 174. Example Computer-Based Multi-Agent Simulation Techniques Enabled by the Platform FIG. 1B illustrates, at 190, example multi-agent simulation techniques 194 enabled by the multi-agent simulator platform, in accordance with some implementations of the present technology. For example, techniques 194 can include, but are not limited to, adaptive modeling, agent instantiation, agent calibration, question generation, multimodal input processing, agent query techniques, sentiment modeling, synthetic training data generation, and agent validation. Example results 196 of such techniques are further described below.
Adaptive Modeling Techniques The platform can enable users to configure virtual worlds for simulations using adaptive modeling techniques. Specifically, these techniques can be utilized to model information diffusion trends using user-specified definitions of virtual worlds. For instance, users can input rules, constraints, event identifiers, minimum agent quantity, minimally sufficient agent traits, minimally sufficient trait types, and so forth to cause the platform to generate a simulation space.

After generating a particular simulation space, the platform can calibrate agents to the environment. For example, the platform can generate agent interaction rules influenced by environmental factors, such as information/news diffusion, agent proximity to one another, agent proximity to information centers, social media trends, economic indicators, and so forth. The platform can then create agents with diverse characteristics (traits), including demographic traits (e.g., age, gender, occupation, education level), preferences (e.g., hobbies, interests, values), interests (e.g., topics, activities, causes), personality traits (e.g., extraversion, agreeableness, conscientiousness), skills (e.g., language proficiency, technical expertise, problem-solving abilities), knowledge levels (e.g., domain-specific expertise, general knowledge), emotional states (e.g., emotional intelligence, sentiment, mood, impression, risk assessment feedback), social connections (e.g., social networks, relationships, group affiliations), cultural backgrounds (e.g., ethnicity, nationality, socioeconomic status), product preferences, product ownership status, and/or physical or cognitive abilities (e.g., disabilities, health conditions, cognitive impairments). By incorporating these characteristics in various suitable combinations, the platform can deploy agents that exhibit realistic and nuanced behaviors, allowing for more accurate and informative simulations.

An example of adaptive modeling is trait diffusion modeling. Trait diffusion modeling refers to a type of adaptive modeling technique used to simulate the spread or distribution of traits, characteristics, or behaviors within a population or system. The goal of trait diffusion modeling is to generate realistic and nuanced simulations of complex systems, such as social networks, markets, or ecosystems, by modeling how traits diffuse and evolve over time. The distribution of traits within a population can be modeled using statistical distributions, such as normal or random distributions, or more complex models that account for social influence, network effects, or other factors that shape the spread of traits.

Question Generation Techniques

The platform can include an artificial intelligence-based question generator. For example, an intelligent question recommender engine can take into account news, market events, regulations, and other data sources to recommend contextually relevant questions. These questions can be automatically generated to assist with creating virtual worlds, recommending agent traits, refining hypotheses, and recommending follow-up hypotheses in chain-of-thought scenario modeling. For example, users can input a seed phrase or set of terms for questions, and the engine can determine additional context, generate a set of questions, and enable users to select and further tune the questions.

In an example use case, the platform can incorporate improved techniques for recommending contextually relevant questions that users can ask to increase the quality and reach of simulations. These automatically generated questions can assist with various tasks, including recommending attributes for creating on-point virtual worlds, identifying relevant traits for agents, refining initial hypotheses, and suggesting follow-up hypotheses. To achieve this, the platform can employ a method that begins by accepting user input in the form of a seed phrase or set of terms for questions, which provides a minimally sufficient basis for identifying the topic of interest, such as "will medical device N be approved at next board meeting?" The platform can then determine additional context using supplemental data sources, such as "with respect to device N, simulate board review outcomes A, B, C given constraints X, Y, Z." Next, the platform can generate and serve a set of questions, by simulating voting patterns of a group of individuals, such as a medical review board. To that end, the platform can instantiate a set of agents that mirror a particular real-world entity, individual, or group by, for example, determining and applying a set of relevant traits for agents. Finally, the platform can enable users to select and further tune the questions, and use the questions to initiate simulations, such as "with respect to outcome A (safety), given constraint X (phase 1 safety study), what additional information is the board likely to need to support recommendation to approve device N?"

Agent Instantiation and Calibration Techniques

The platform also can implement agent instantiation and calibration techniques according to agent evolution logic. Agent calibration can be accomplished by dynamically changing quantities of agents/traits when modeling sequences of events. These techniques can manage agent populations based on conditional events and can support single-agent modeling. For instance, the platform can receive virtual world characteristics and a set of questions, generate a synthetic population, assign traits based on probability distribution, and generate a response using the synthetic population. Additionally, the platform can enable users to temporally or conditionally chain agents using agent query techniques. These techniques can evolve agent traits and can enable chain-of-thought reasoning. For example, users can generate a response to a particular question using a synthetic population, drill down to an individual in the population, create an agent communication session, and receive or suggest additional follow-up questions. In some implementations, the platform can spawn additional agents and/or evolve agent traits based on a conditional event.

One example use case for the platform involves instantiating a group of agents representing investors, financial analysts, and company executives, all with diverse characteristics and behaviors. Initially, these agents can interact and make decisions based on current market trends and the company's financial performance. However, when a conditional event occurs, such as a supply chain disruption affecting the company's ability to deliver products, the platform can spawn additional agents representing logistics experts, suppliers, and crisis management teams. These new agents can bring unique perspectives and expertise to the simulation, allowing the platform to model the complex interactions and decision-making processes that occur in response to the disruption. As the simulation unfolds, the platform can continue to adapt and evolve the agent population, enabling users to explore the potential consequences of different scenarios and strategic decisions.

Multimodal Input Processing

The platform can include a multimodal input processor that can capture inventive features related to ingesting multimodal data. This processor can transform and align multimodal data with a universal data schema (e.g., XML, JSON, table, relational database, key-value sets, or the like), enabling feature engineering and improved simulation capabilities. For instance, the platform can receive multimodal input, such as scenario, world, agents, question parameters and so forth, in various forms, including image, video, audio, text, source code, computer executable code, pseudo code, and the like. The platform can generate a data schema and process the input data using modality-specific logic to populate the data schema.

For example, when receiving video input, the platform can employ automated speech recognition (ASR) and/or computer vision techniques to transcribe spoken language and extract relevant text from visual elements, such as captions, subtitles, or displayed text. The extracted text can then undergo tokenization, where it is broken down into individual words, phrases, or symbols, known as tokens. These tokens can be further processed using natural language processing (NLP) techniques, such as part-of-speech tagging, named entity recognition, and dependency parsing. Finally, the tokens can be vectorized, where each token is represented as a numerical vector in a high-dimensional space, enabling the platform to perform semantic analysis, sentiment analysis, and other machine learning tasks on the video-derived text data. Additionally or alternatively, the platform can use image-to-text conversion techniques to generate descriptions of images, parse descriptions into sets of attributes, and vectorize the attributes. Accordingly, the universal data schema can include attributes or properties that describe any of the items disclosed herein, such as environments, questions, queries, agents, traits, rules, and so forth.

Sentiment Modeling

The platform can include a sentiment modeler that can capture feedback of instantiated agents regarding markets, products, and so forth (e.g., in advertisement testing). This platform can quickly evaluate variants of scenarios by changing relevant attributes in the universal schema and testing new hypotheses. For example, the platform can receive multimodal input, use the multimodal input generate and populate a data schema, receive a follow-up question or hypothesis, change attributes in the schema, and change output modality. In a use case, the platform can initially position a product against a white background and test hypotheses by determining how agent sentiment changes when the background color is changed. In another use case, the platform can change modality of an input item (e.g., convert sets of images to videos, reels, short movies, social media stories, and so forth).

In other examples, the platform can apply the sentiment modeler to various scenarios. For instance, the platform can test the impact of different musical soundtracks on agent sentiment in a commercial advertisement, by changing the audio attributes in the universal schema and analyzing the resulting sentiment shifts. In another example, the platform can evaluate how agent sentiment changes when a product's packaging design is modified, by altering the visual attributes in the schema and assessing the effects on agent feedback. Additionally, the platform can explore the influence of different narrative structures on agent engagement, by changing the storytelling attributes in the schema and measuring the resulting changes in agent sentiment. Furthermore, the platform can examine the impact of various social media influencers on agent sentiment, by modifying the influencer attributes in the schema and analyzing the effects on agent feedback.

Synthetic Training Data Generator

Other features of the platform can include a synthetic training data generator. The synthetic training data generator can enable users to create customized training datasets for agent-based models, which can be particularly useful when real-world data is scarce, biased, or expensive to obtain. This feature can leverage various techniques, such as generative adversarial networks (GANs), variational autoencoders (VAEs), or Bayesian networks, to generate synthetic data that mimics the characteristics of real-world data. The platform can allow users to specify the parameters of the synthetic data generation process, such as the distribution of variables, the relationships between variables, and the level of noise or uncertainty. Additionally, the platform can provide tools for evaluating the quality and realism of the synthetic data, such as statistical metrics, data visualization, or human evaluation. By providing a synthetic training data generator, the platform can enable users to develop and train more accurate and robust agent-based models, and reduce their reliance on real-world data. This can be particularly useful for applications where data is limited or sensitive, such as in finance, healthcare, or education.

Agent Validation Techniques

Other features of the platform can include agent validation techniques. According to various examples, agent validation techniques can include agent cross-validation, which enables users to evaluate the performance and robustness of agent-based models. This can be implemented through various suitable methods, such as k-fold cross-validation, leave-one-out cross-validation, or bootstrapping. For instance, the platform can divide the agent population into training and testing sets, and then use the training set to train the agent-based model and the testing set to evaluate its performance. The platform can repeat this process multiple times, using different subsets of the agent population, to obtain a more robust estimate of the model's performance. Additionally, the platform can use techniques such as walk-forward optimization to evaluate the performance of agent-based models over time, and identify potential issues with model drift or overfitting.

By providing agent validation techniques, the platform can enable users to develop and refine more accurate and effective agent-based models, and increase confidence in the results of their simulations.

Example Computing Systems

Figure 2:
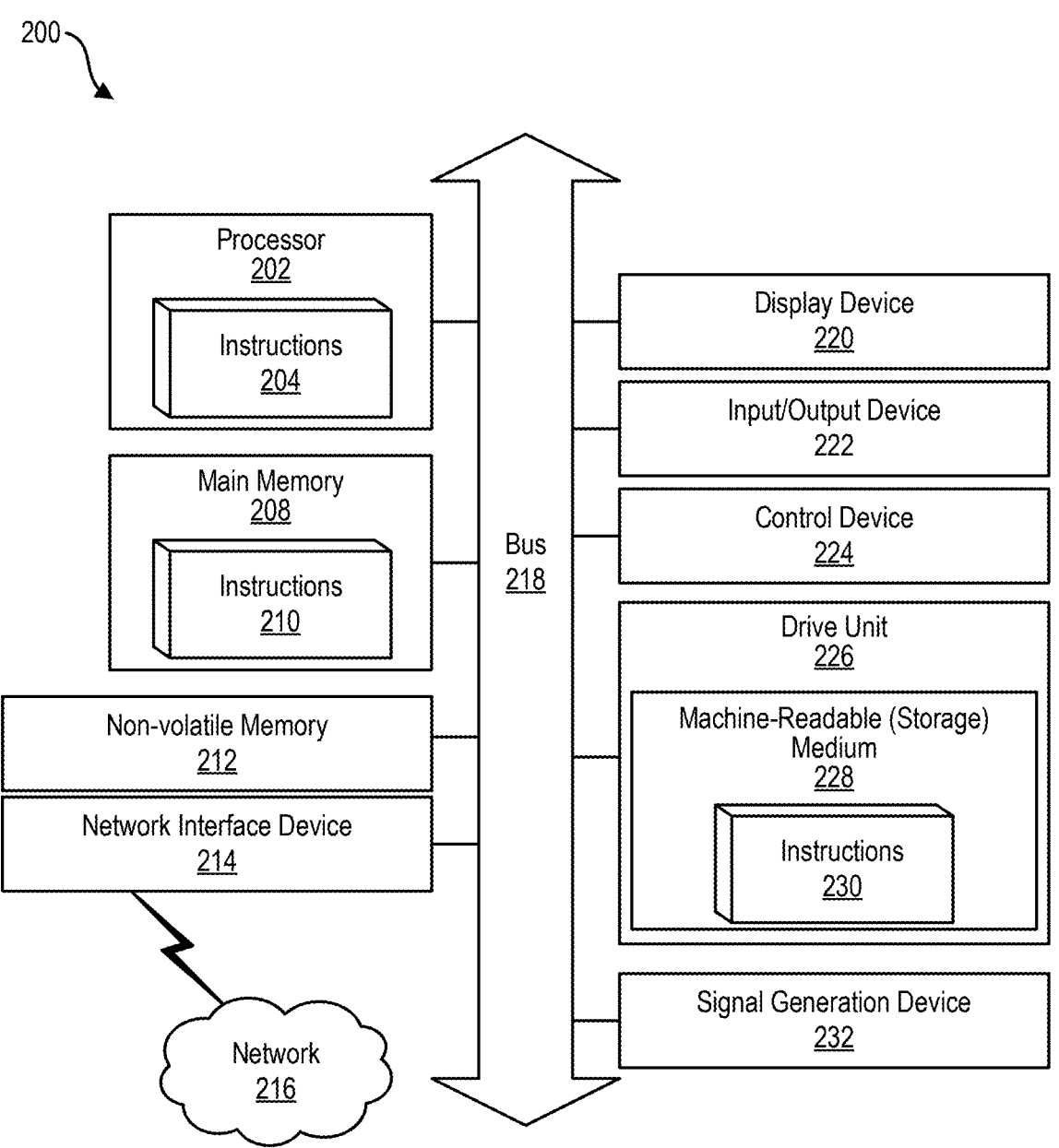
FIG. 2 is a block diagram showing some of the compo-nents typically incorporated in at least some of the computer systems and other devices on which multi-agent simulator platform operates in accordance with some implementations of the present technology.

FIG. 2 is a block diagram showing some of the components typically incorporated in at least some of the computer systems and other devices on which the multi-agent simulator platform operates in accordance with some implementations of the present technology. As shown, an example computer system 200 can include: one or more processors 202, main memory 208, non-volatile memory 210, a network interface device 214, video display device 220, an input/output device 222, a control device 224 (e.g., keyboard and pointing device), a drive unit 226 that includes a machine-readable medium 228, and a signal generation device 232 that are communicatively connected to a bus 218. The bus 218 represents one or more physical buses and/or point-to-point connections that are connected by appropriate bridges, adapters, or controllers. Various common components (e.g., cache memory) are omitted from FIG. 2 for brevity. Instead, the computer system 200 is intended to illustrate a hardware device on which components illustrated or described relative to the examples of the figures and any other components described in this specification can be implemented.

The computer system 200 can take any suitable physical form. For example, the computer system 200 can share a similar architecture to that of a server computer, personal computer (PC), tablet computer, mobile telephone, game console, music player, wearable electronic device, network-connected ("smart") device (e.g., a television or home assistant device), AR/VR systems (e.g., head-mounted display), or any electronic device capable of executing a set of instructions that specify action(s) to be taken by the computer system 200. In some implementations, the computer system 200 can be an embedded computer system, a system-on-chip (SOC), a single-board computer system (SBC) or a distributed system such as a mesh of computer systems or include one or more cloud components in one or more networks. Where appropriate, one or more computer systems 600 can perform operations in real-time, near real-time, or in batch mode.

The network interface device 214 enables the computer system 200 to exchange data in a network 216 with an entity that is external to the computing system 200 through any communication protocol supported by the computer system 200 and the external entity. Examples of the network interface device 214 include a network adaptor card, a wireless network interface card, a router, an access point, a wireless router, a switch, a multilayer switch, a protocol converter, a gateway, a bridge, bridge router, a hub, a digital media receiver, and/or a repeater, as well as all wireless elements noted herein.

The memory (e.g., main memory 208, non-volatile memory 212, machine-readable medium 228) can be local, remote, or distributed. Although shown as a single medium, the machine-readable medium 228 can include multiple media (e.g., a centralized/distributed database and/or associated caches and servers) that store one or more sets of instructions 230. The machine-readable (storage) medium 228 can include any medium that is capable of storing, encoding, or carrying a set of instructions for execution by the computer system 200. The machine-readable medium 228 can be non-transitory or comprise a non-transitory device. In this context, a non-transitory storage medium can include a device that is tangible, meaning that the device has a concrete physical form, although the device can change its physical state. Thus, for example, non-transitory refers to a device remaining tangible despite this change in state.

Although implementations have been described in the context of fully functioning computing devices, the various examples are capable of being distributed as a program product in a variety of forms. Examples of machine-readable storage media, machine-readable media, or computer-readable media include recordable-type media such as volatile and non-volatile memory, removable memory, hard disk drives, optical disks, and transmission-type media such as digital and analog communication links.

In general, the routines executed to implement examples herein can be implemented as part of an operating system or a specific application, component, program, object, module, or sequence of instructions (collectively referred to as "computer programs"). The computer programs typically comprise one or more instructions (e.g., instructions 210, 230) set at various times in various memory and storage devices in computing device(s). When read and executed by the processor 202, the instruction(s) cause the computer system 200 to perform operations to execute elements involving the various aspects of the disclosure.

Example Computing Environments

Figure 3:
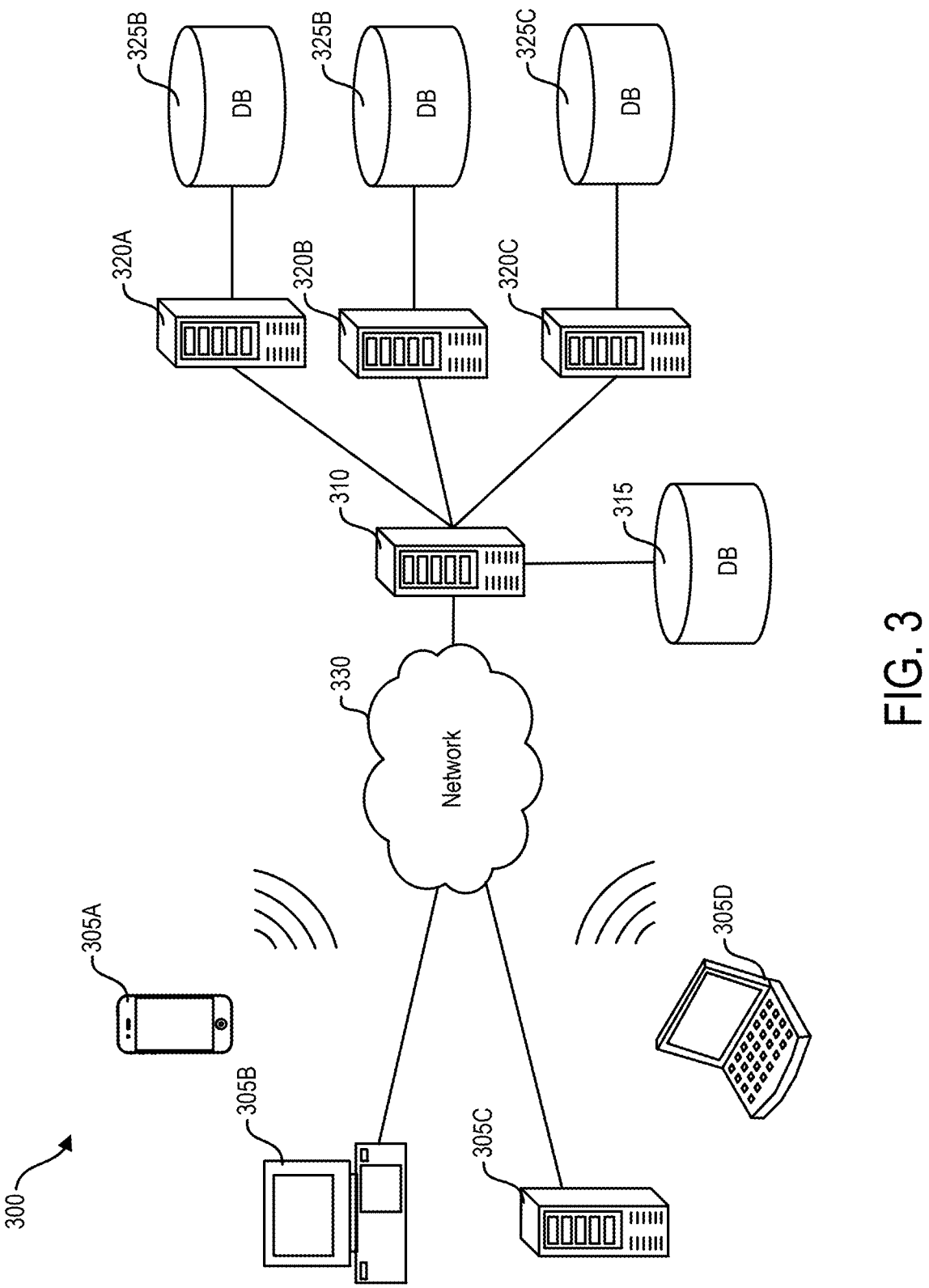
FIG. 3 is a system diagram illustrating an example of a computing environment in which the multi-agent simulator platform operates in some implementations of the present technology.

FIG. 3 is a system diagram illustrating an example of a computing environment in which the multi-agent simulator platform operates in some implementations of the present technology. In some implementations, environment 300 includes one or more client computing devices 305A-D, examples of which can host various components of the multi-agent simulator platform of FIG. 1. Client computing devices 305 operate in a networked environment using logical connections through network 330 to one or more remote computers, such as a server computing device.

In some implementations, server 310 is an edge server which receives client requests and coordinates fulfillment of those requests through other servers, such as servers 320A-C. In some implementations, server computing devices 310 and 320 comprise computing systems. Though each server computing device 310 and 320 is displayed logically as a single server, server computing devices can each be a distributed computing environment encompassing multiple computing devices located at the same or at geographically disparate physical locations. In some implementations, each server 320 corresponds to a group of servers.

Client computing devices 305 and server computing devices 310 and 320 can each act as a server or client to other server or client devices. In some implementations, servers (310, 320A-C) connect to a corresponding database (315, 325A-C). As discussed above, each server 320 can correspond to a group of servers, and each of these servers can share a database or can have its own database. Databases 315 and 325 warehouse (e.g., store) information such as inputs, libraries, configuration data, agent outputs, extracted data and so forth. Though databases 315 and 325 are displayed logically as single units, databases 315 and 325 can each be a distributed computing environment encompassing multiple computing devices, can be located within their corresponding server, or can be located at the same or at geographically disparate physical locations.

Network 330 can be a local area network (LAN) or a wide area network (WAN), but can also be other wired or wireless networks. In some implementations, network 330 is the Internet or some other public or private network. Client computing devices 305 are connected to network 330 through a network interface, such as by wired or wireless communication. While the connections between server 310 and servers 320 are shown as separate connections, these connections can be any kind of local, wide area, wired, or wireless network, including network 330 or a separate public or private network.

Example AI/ML Stack

Figure 4:
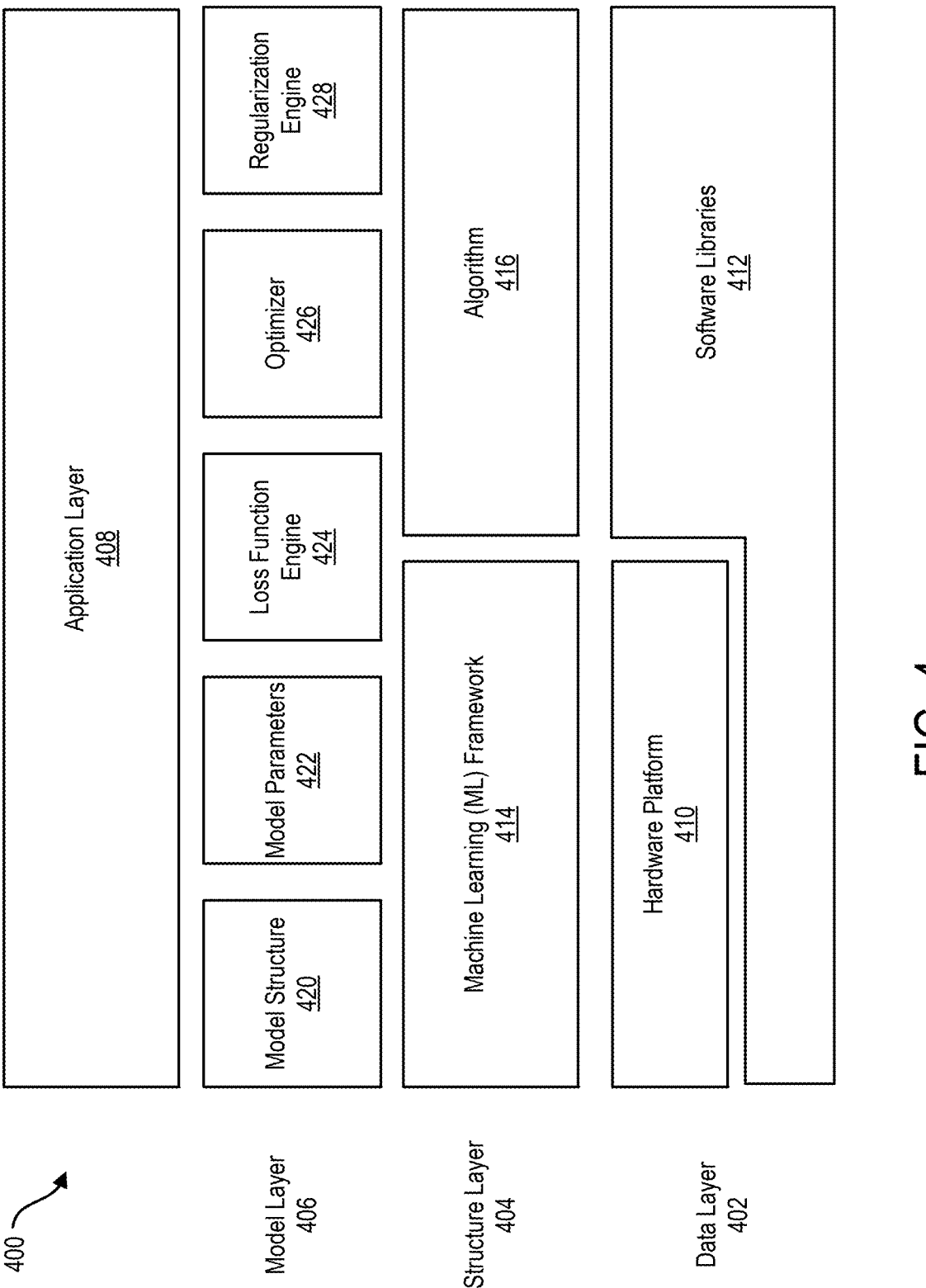
FIG. 4 is a block diagram illustrating an example AI/ML stack of the multi-agent simulator platform, according to some arrangements.

FIG. 4 is a block diagram illustrating an example AI/ML stack of the platform, according to some arrangements. According to various implementations, the AI/ML stack can include AI/ML models, such as large agent models, small agent models, or additional AI/ML models.

As shown, the AI stack can include a set of layers, which conceptually organize elements within an example network topology for the AI system's architecture to implement a particular AI model. Generally, an AI model is a computer-executable program implemented by the AI stack that analyzes data to make predictions. Information can pass through each layer of the AI stack to generate outputs for the AI model. The layers can include a data layer 402, a structure layer 404, a model layer 406, and an application layer 408. The algorithm 416 of the structure layer 404 and the model structure 420 and model parameters 422 of the model layer 406 together form an example AI model. The optimizer 426, loss function engine 424, and regularization engine 428 work to refine and optimize the AI model, and the data layer 402 provides resources and support for application of the AI model by the application layer 408. The application layer 408 can include, in whole or in part, executables included in an application that enables users to access and interact with the platform (such as, for example, user interfaces).

The data layer 402 acts as the foundation of the AI stack by preparing data for the AI model. As shown, the data layer 402 can include two sub-layers: a hardware platform 410 and one or more software libraries 412. The hardware platform 410 can perform operations for the AI model and include computing resources for storage, memory, logic and networking. The hardware platform 410 can perform back-end operations such as matrix calculations, parallel calculations, machine learning (ML) training, and the like. Examples of components used by the hardware platform 410 include central processing units (CPUs) and graphics processing units (GPUs). CPUs are electronic circuitry designed to execute instructions for computer programs, such as arithmetic, logic, controlling, and input/output (I/O) operations, and can be implemented on integrated circuit (IC) microprocessors. GPUs are electric circuits that were originally designed for graphics manipulation and output but may be used for AI applications due to their vast computing and memory resources. GPUs use a parallel structure that generally makes their processing more efficient than that of CPUs. In some instances, the hardware platform 410 can include Infrastructure as a Service (IaaS) resources, which are computing resources (e.g., servers, memory, etc.) offered by a cloud services provider. The hardware platform 410 can also include computer memory for storing data about the AI model, application of the AI model, and training data for the AI model. The computer memory can be a form of random-access memory (RAM), such as dynamic RAM, static RAM, and non-volatile RAM.

The software libraries 412 can be thought of as suites of data and programming code, including executables, used to control the computing resources of the hardware platform 310. The programming code can include low-level primitives (e.g., fundamental language elements) that form the foundation of one or more low-level programming languages, such that the hardware platform 410 can use the low-level primitives to carry out specific operations. The low-level programming languages do not require much, if any, abstraction from a computing resource's instruction set architecture, allowing them to run quickly with a small memory footprint. Examples of software libraries 412 that can be included in the AI stack include Intel Math Kernel Library, Nvidia cuDNN™, Eigen, and Open BLAS.

The structure layer 404 can include an ML framework 414 and one or more of an algorithm 416. The ML framework 414 can be thought of as an interface, library, or tool that allows users to build and deploy the AI model. The ML framework 414 can include an open-source library, an application programming interface (API), a gradient-boosting library, an ensemble method, and/or a deep learning toolkit that can work with the layers of the AI system facilitate development of the AI model. For example, the ML framework 414 can be invoked to distribute processes for application or training of the AI model across multiple resources in the hardware platform 410. The ML framework 414 can also include a set of pre-built components that have the functionality to implement and train the AI model and allow users to use pre-built functions and classes to construct and train the AI model. Thus, the ML framework 414 can be used to facilitate data engineering, development, hyperparameter tuning, testing, and training for the AI model. Examples of ML frameworks 314 that can be used in the AI stack include TensorFlow™, PyTorch™, Scikit-Learn™, Keras™, Cafffe, LightGBM, Random Forest, and AWS™.

The algorithm 416 can be an organized set of computer-executable operations used to generate output data from a set of input data and can sometimes be described using pseudocode. The algorithm 416 can include complex code that allows the computing resources to learn from new input data and create new/modified outputs based on what was learned.

The algorithm 416 can build the AI model through being trained (e.g., via a model training engine, which can include a user interface having controls sufficient to enable a user to interact with the model, label data, and so forth) while running computing resources of the hardware platform 410. This training allows the algorithm 416 to make predictions or decisions without being explicitly programmed to do so.

Once trained, the algorithm 416 can run at the computing resources as part of the AI model to make predictions or decisions, improve computing resource performance, or perform tasks. The algorithm 416 can be trained using supervised learning, unsupervised learning, semi-supervised learning, and/or reinforcement learning.

The model layer 406 can implement the AI model using data from the data layer and the algorithm 416 and ML framework 414 from the structure layer 404, thus enabling decision-making capabilities of the AI stack. The model layer 406 can include any of a model structure 420, model parameters 422, a loss function engine 424, an optimizer 426, and a regularization engine 428.

The model structure 420 describes the architecture of the AI model of the AI stack. The model structure 420 defines the complexity of the pattern/relationship that the AI model expresses. Examples of structures that can be used as the model structure 420 include decision trees, support vector machines, regression analyses, Bayesian networks, Gaussian processes, genetic algorithms, and artificial neural networks (or, simply, neural networks). The model structure 420 can include a number of structure layers, a number of nodes (or neurons) at each structure layer, and activation functions of each node. Each node's activation function defines how to node converts data received to data output. The structure layers may include an input layer of nodes that receive input data, an output layer of nodes that produce output data. The model structure 420 may include one or more hidden layers of nodes between the input and output layers. The model structure 420 can be an Artificial Neural Network (or, simply, neural network) that connects the nodes in the structured layers such that the nodes are interconnected. Examples of neural networks include Feedforward Neural Networks, convolutional neural networks (CNNs), Recurrent Neural Networks (RNNs), Autoencoder, Variational Autoencoder (VAE), and Generative Adversarial Networks (GANs).

In some examples, neural networks can implement computer vision algorithms. Computer vision algorithms can perform object detection, object localization, semantic segmentation, pose estimation, and similar tasks. For example, to perform two-step object detection, a Region Proposal Network (RPN) can generate a set of candidate regions that may contain a particular object. The region proposals (e.g., sets of pixel coordinates) can then be passed to a neural classifier network. To perform one-step object detection, a neural network can combine the object detection and classification steps. Once identified, objects can be localized. For example, objects can be marked with a bounding box, which can be, for example, identified by a convolutional neural network that generates a set of at least three coordinates in a particular pixel space. Further, semantic segmentation can be applied by convolutional neural networks to objects identified by the bounding boxes to identify regions of objects.

In some examples, neural networks can implement generative algorithms. Examples of neural networks that can implement generative algorithms include deep learning models, such as GANs, VAEs, and/or diffusion models.

In one example, to generate an image that includes a specified input object (for example, an object identified by a CNN), a computing platform can utilize a GAN. An example GAN consists of two neural networks: a generator and a discriminator. The generator can create new data instances, such as images, while the discriminator can evaluate them for authenticity. To include an input object in the generated image, the GAN can be trained using the input object as a conditioning variable. The conditioning variable can provide information to the generator about the specific object that should be included in the generated image. By learning about the input object as a conditional input during the training process, the generator can learn to produce images that incorporate the specified object. Once trained, the generator can take the input object and produce an image that includes the input object, based on the learned associations and patterns in the training data. This process allows GANs to generate images that contain specific input objects.

In another example, to generate an image that includes the specified input object, a computing platform can utilize a VAE. A VAE can be conditioned on the input object during the encoding and decoding process. The conditioning allows the VAE to learn the correlations between the input object and the corresponding image features. During generation, the conditioned VAE can produce an image that includes the specified object.

In another example, to generate an image that includes the specified input object, a computing platform can utilize a diffusion model. A diffusion model can iteratively update a set of pixel values to maximize the likelihood of the specified input object being present in the generated image. The diffusion process involves propagating the information regarding the input object through the image and influencing the generation of each pixel based on the conditional input that can include the specified input object. By iteratively applying the diffusion process, the model can generate an image that incorporates the specified input object.

The model parameters 422 represent the relationships learned by a model during training and can be used to make predictions and decisions based on input data. The model parameters 422 can weight and bias the nodes and connections of the model structure 420. For instance, when the model structure 420 is a neural network, the model parameters 422 can weight and bias the nodes in each layer of the neural networks, such that the weights determine the strength of the nodes and the biases determine the thresholds for the activation functions of each node. The model parameters 422, in conjunction with the activation functions of the nodes, determine how input data is transformed into desired outputs. The model parameters 422 can be automatically determined and/or altered during training of the algorithm 416.

The loss function engine 424 can determine a loss function, which is a metric used to evaluate the AI model's performance during training. For instance, the loss function engine 424 can measure the difference between a predicted output of the AI model and the actual output of the AI model and is used to guide optimization of the AI model during training to minimize the loss function. The loss function may be presented via the ML framework 414, such that a user can determine whether to retrain or otherwise alter the algorithm 416 if the loss function is over a threshold. In some instances, the algorithm 416 can be retrained automatically if the loss function is over the threshold. Examples of loss functions include a binary-cross entropy function, hinge loss function, regression loss function (e.g., mean square error, quadratic loss, etc.), mean absolute error function, smooth mean absolute error function, log-cos h loss function, and quantile loss function.

The optimizer 426 adjusts the model parameters 422 to minimize the loss function during training of the algorithm 416. In other words, the optimizer 426 uses the loss function generated by the loss function engine 424 as a guide to determine what model parameters lead to the most accurate AI model. Examples of optimizers include Gradient Descent (GD), Adaptive Gradient Algorithm (AdaGrad), Adaptive Moment Estimation (Adam), Root Mean Square Propagation (RMSprop), Radial Base Function (RBF) and Limited-memory BFGS (L-BFGS). The type of optimizer 426 used may be determined based on the type of model structure 420 and the size of data and the computing resources available in the data layer 402.

The regularization engine 428 executes regularization operations. Regularization is a technique that prevents over- and under-fitting of the AI model. Overfitting occurs when the algorithm 416 is overly complex and too adapted to the training data, which can result in poor performance of the AI model. Underfitting occurs when the algorithm 416 is unable to recognize even basic patterns from the training data such that it cannot perform well on training data or on validation data. The optimizer 426 can apply one or more regularization techniques to fit the algorithm 416 to the training data properly, which helps constrain the resulting AI model and improves its ability for generalized application. Examples of regularization techniques include lasso (L1) regularization, ridge (L2) regularization, and elastic (L1 and L2 regularization).

Agent Evolutionary Framework Using Example Control and Data Entities

Figure 5:
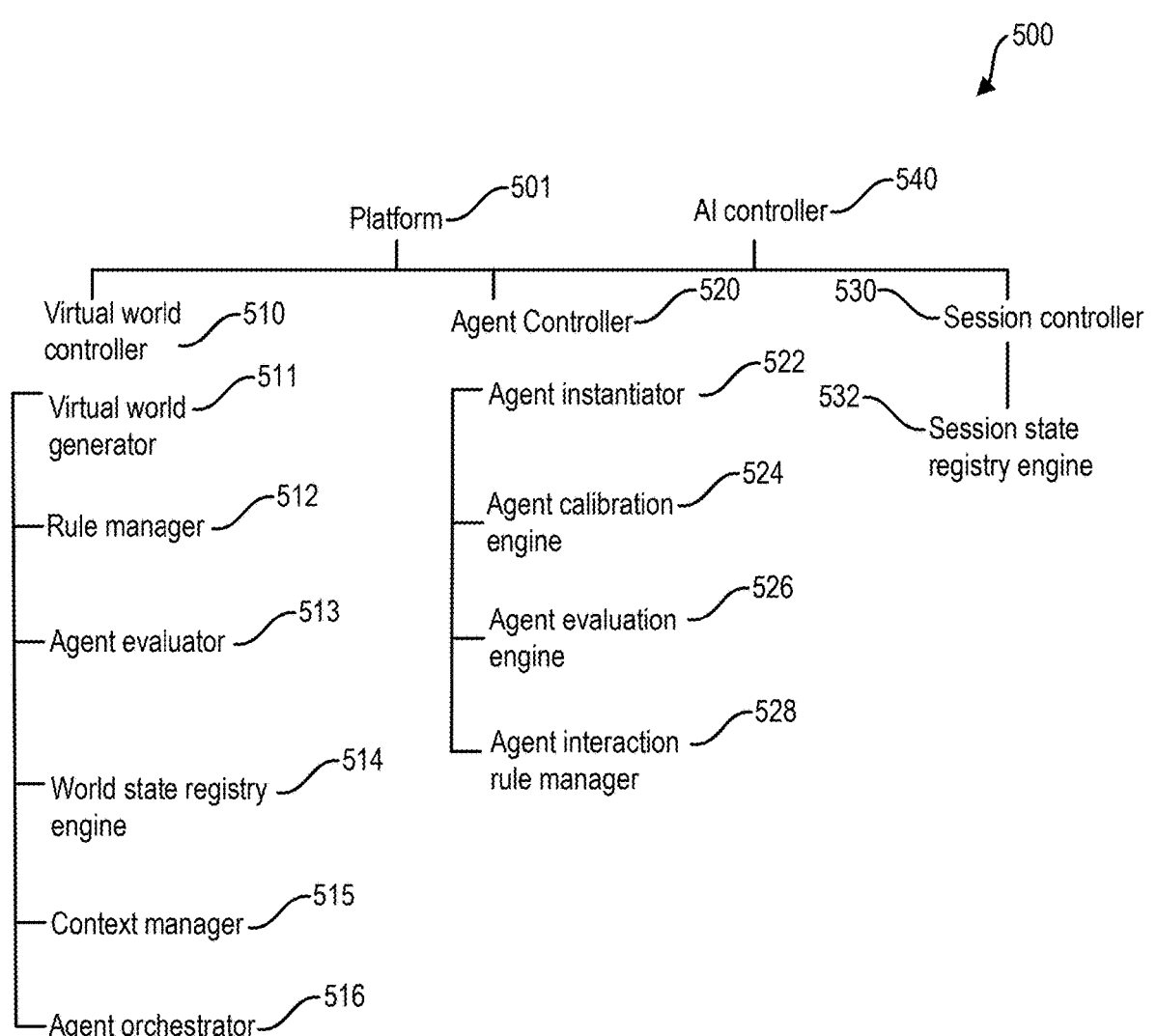
FIG. 5 is an architecture diagram showing example con-trol entities in the multi-agent simulator platform, according to some arrangements.
Figure 6:
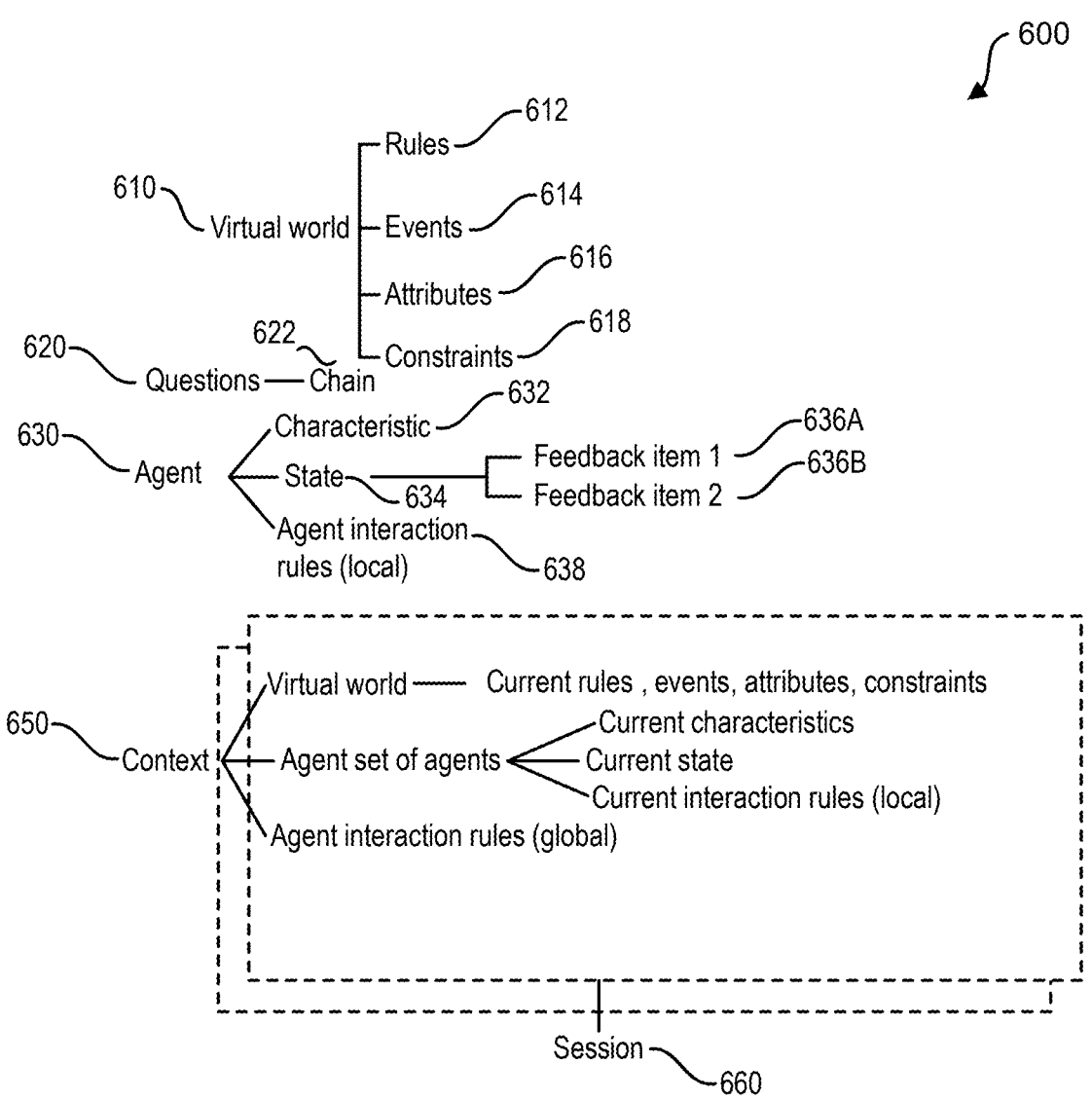
FIG. 6 is a block diagram showing example data entities in the multi-agent simulator platform, according to some arrangements.

FIG. 5 is an architecture diagram showing example control entities 500 in the multi-agent simulator platform, according to some arrangements, and FIG. 6 is a block diagram showing example data entities 600 in the multi-agent simulator platform, according to some arrangements. One of skill will appreciate that, in various implementations, control entities 500 and data entities 600 can be omitted and/or combined at least in part. In some implementations, for example, data entities can include control entities (e.g., when implemented as executables that include compiled code in an object-oriented language, where a class (e.g., a data entity 600) can include both data declarations and functions (e.g., control entities 500). More generally, control entities 500 are executable components that govern the behavior of the multi-agent simulator platform, such as simulation logic, agent decision-making, and interaction protocols, and data entities 600 are data structures that store and manage data used by the platform, such as agent attributes, simulation parameters, and output results. Throughout simulation sessions, agents can evolve by adapting to the changing world.

As shown, data entities can include one or more of each of a virtual world 610, question 620, agent 630, context 650 and session 660. Entities can have properties, which can be implemented as records, relational tables, items in key-value pairs, tags, labels, metadata, or in another suitable form. Properties of a particular virtual world 610 entity can include rules 612, events 614, attributes 616, and constraints 618. Properties of a particular question 620 entity can include question chains 622. Properties of a particular agent 630 entity can include agent characteristics 632 (e.g., traits), agent state 634, agent feedback items (636a, 636b), and local agent interaction rules 638. Properties of a particular context 650 entity can include, for each of a set of sessions 660 included in the context 650, state of the virtual world, sets of agents used in a particular set of simulation sessions, sets of current agent characteristics, states, and local interaction rules, sets of global agent interaction rules, and so forth.

Correspondingly, the platform can include a virtual world controller 510, which can include a virtual world generator 511, rules manager 512, agent evaluator 513, world state registry engine 514, context manager 515, and agent orchestrator 516. The platform can include an agent controller 520, which can include an agent instantiator 522, agent calibration engine 524, agent evolution engine 526, and agent interaction rule manager 528. The platform can include a session controller 530, which can include a session state registry engine 532. The platform can also include an AI controller 540 (e.g., controller 120 of FIG. 1), which can manage model configurations, federated learning functions, and other training.

The virtual world controller 510 manages the virtual world 610, which includes rules 612, events 614, attributes 616, and constraints 618. Rules 612 are predefined conditions that govern the behavior of agents within the virtual world, such as laws, norms, or physical laws. Events 614 are occurrences that take place within the virtual world, such as changes in agent state or interactions between agents. Attributes 616 are characteristics of the virtual world, such as geography, climate, or economic conditions. Constraints 618 are limitations or restrictions on the behavior of agents within the virtual world, such as resource limitations or physical barriers. The state of the virtual world refers to the current status of the world's attributes, events, and agent interactions at a particular point in time, including, for example, the current geography, climate, economic conditions, agent locations, and agent actions. The virtual world controller 510 includes a virtual world generator 511, which creates the virtual world based on the defined rules, events, attributes, and constraints. The rules manager 512 ensures that the rules are enforced within the virtual world. The agent evaluator 513 assesses the behavior of agents within the virtual world. The world state registry engine 514 tracks the current state of the virtual world. The context manager 515 manages the context in which the virtual world is simulated. The agent orchestrator 516 coordinates the interactions between agents within the virtual world.

The agent controller 520 manages the agent 630, which includes agent characteristics 632, agent state 634, agent feedback items (636a, 636b), and local agent interaction rules 638. Agent characteristics 632 are the properties that define an agent, such as traits, skills, knowledge, attitudes, and experiences. Agent state 634 refers to the current status of the agent's characteristics, actions, and interactions at a particular point in time (i.e. for a particular simulation session). Agent feedback items (636a, 636b) are the responses or reactions of the agent to events or interactions within the virtual world. Local agent interaction rules 638 are the rules that govern the behavior of the agent in interactions with other agents, such as rules for communication, cooperation, or competition. For example, a local agent interaction rule 638 might specify that an agent will only communicate with other agents that share similar characteristics or goals. Local action interaction rules 638 can also include logic (e.g., executables, circuits) for invoking models for the agents to perform tasks in response to questions 620. In some implementations, local agent interaction rules 638 can include model selection logic (e.g., selecting a model based on the type of output (qualitative or quantitative), modality of output, or other parameters). The agent controller 520 includes an agent instantiator 522, which creates instances of agents based on the defined agent characteristics. The agent calibration engine 524 adjusts the agent's characteristics and behavior to match the desired simulation parameters, such as calibrating the agent's decision-making process to match statistical distributions of human decision-making, like a normal distribution for risk tolerance or a power law distribution for social network connections. The agent evolution engine 526 updates the agent's characteristics and behavior over time based on interactions and events within the virtual world. The agent interaction rule manager 528 ensures that the local agent interaction rules are enforced during agent interactions.

The context manager 515 manages the context 650, which includes the state of the virtual world, sets of agents used in a particular set of simulation sessions, sets of current agent characteristics, states, and local interaction rules, sets of global agent interaction rules, and so forth. Global agent interaction rules are rules that govern the behavior of all agents within the virtual world, such as rules for resource allocation, conflict resolution, or information sharing. For example, a global agent interaction rule might specify that agents must share information about certain world events (e.g., environmental hazards) or that agents cannot allocate more than a certain percentage of resources to a single task. The context 650 provides the environment and parameters within which the simulation is run, including the specific virtual world, agents, and rules used. The context manager 515 ensures that the context is properly set up and configured for each simulation session. The context manager 515 also tracks changes to the context over time and updates the simulation accordingly.

Consider an example use case. In this example, to investigate the popularity of espresso drinks with the morning crowd in the state of New York (e.g., in response to an experimenter question "How popular are espresso drinks with the morning crowd in the state of New York?"), a virtual world is initialized using the virtual world controller 510. The virtual world generator 511 creates a virtual environment that simulates the morning commute in various cities across New York, including characteristics such as demographics, transportation modes, and coffee shop locations. The rules manager 512 ensures that predefined conditions, such as the availability of coffee shops and the demographics of the morning crowd, are enforced within the virtual world. The world state registry engine 514 tracks the current state of the virtual world, including the location and behavior of agents representing coffee shop customers.

The agent controller 520 instantiates agents within the virtual world, each representing a coffee shop customer with characteristics such as age, income, and coffee preferences. The agent instantiator 522 creates instances of agent entities 630, which are calibrated using the agent calibration engine 524 to match statistical distributions of coffee consumption habits in New York. For example, the agents' coffee preferences are calibrated to match data from surveys or market research on coffee consumption in New York.

The context manager 515 configures the context for the simulation session, defining the parameters and conditions that govern the simulation's execution. The context includes the state of the virtual world, sets of agents used, sets of current agent characteristics, states, and local interaction rules, and global agent interaction rules that govern the behavior of agents in coffee shops. For example, a global agent interaction rule might specify that agents will only purchase coffee from shops that offer their preferred type of coffee.

With the virtual world, agents, and context configured, the simulation can be executed to investigate the popularity of espresso drinks with the morning crowd in New York. The agent orchestrator 516 coordinates the interactions between agents within the virtual world, ensuring that local agent interaction rules are enforced as agents interact with coffee shops and other agents. The simulation output can be analyzed to estimate the demand for espresso drinks in different cities across New York, providing insights for coffee shop owners, marketers, and researchers.

Example Agent Management Operations

Figure 7:
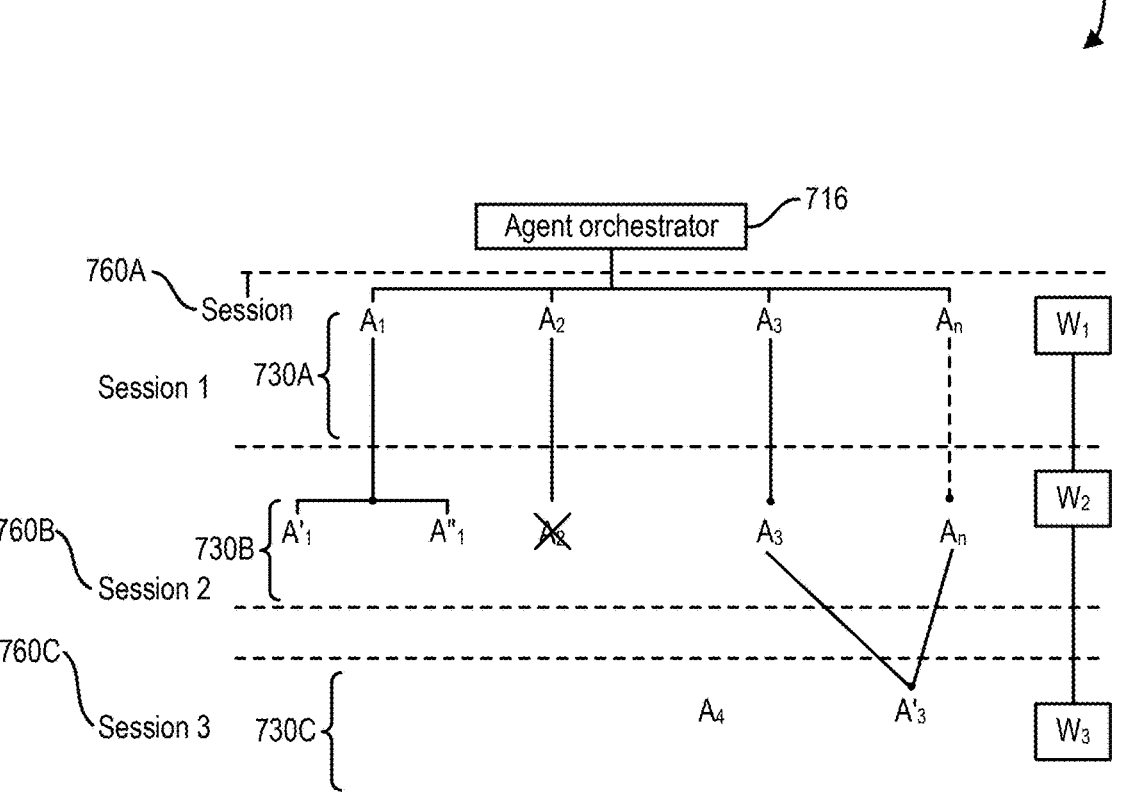
FIG. 7 is a block diagram showing operations for man-aging agent traits across simulation sessions, according to some arrangements.

FIG. 7 is a block diagram 700 showing operations for managing agents, such as evolving agents across simulation sessions, according to some arrangements. Agent evolution operations refer to the processes by which agents are modified, adapted, or transformed to improve their performance, behavior, or characteristics over time. These operations can include mutation, which involves altering an agent's characteristics or behavior; selection, which involves choosing agents with desirable traits or performance; crossover, which involves combining the characteristics or behavior of two or more agents to create new agents; deletion, which involves removing agents that do not meet certain criteria or performance thresholds; and/or combinations thereof. These agent evolution operations enable the platform to adapt and improve the agents over time, allowing for more realistic and effective simulations.

As discussed above and further illustrated in FIGS. 8 and 9, a particular context 650 can include a set of simulation sessions (e.g., 760a, 760b, 760c). For example, a particular context 650 can be generated by the platform in response to a first user question 813 in a set of questions 812. The context 650 can relate to a particular virtual world 610. The platform can generate and/or receive parameters to generate the virtual world 610. The parameters can include rules 612, events 614, attributes 616, and/or constraints 618, which together or in a suitable combination can define at least some aspect of a particular state of the world.

The first simulation session 760a can be performed using items (e.g., data, executables, rules, models, and so forth) relating to the first state of the world W1. The first instantiated agent population 730a can include agents A1, A2, A3 . . . An.

Agent evolution operations can be performed by applying agent evolution logic that can include application of trained models, deterministic rules, or a combination thereof based a change in the state of the world, a change in experimenter questions, and so forth. For example, a change in the state of the world can denote a temporal condition (e.g., world.rule="today is Jan. 1, 2025"), and environmental condition (e.g., world.event="Level EF3 (severe) tornado in the Midwest", world.constraint="imports from country XYZ are subject to 25% tariffs"), or another condition. As shown, the second simulation session 760b can be performed by considering items (e.g., data, executables, rules, models, and so forth) relating to the second state of the world W2. The second instantiated agent population 730b can include agents A1', A1", A3 . . . . An.

Here, the platform can generate the second instantiated agent population 730b based at least in part on the first agent population 730a, thereby refining the simulation. For example, the platform can generate a subset of agents by performing a mutation operation (e.g., mutating agent A1 to generate agents A1' and A1"). An input set of agents for performing the mutation or selection operation can include agents whose performance meets or exceeds a predetermined fitness threshold (e.g., an R-squared value, an F1 score), is within a quality range (e.g., top 25% of agents from the first instantiated agent population 730a, top 50% of agents, top N agents), and/or has a particular characteristic (e.g., a particular trait, geography, state, or agent interaction rule). For example, the platform can select agents that have demonstrated expertise in navigating complex transportation networks, which can be reflected in their agent characteristics, such as having a high value (e.g. N>7/10) for the "navigation skill" trait, indicating their ability to efficiently navigate through complex networks, possessing knowledge of specific transportation routes, schedules, and modes, which can be represented as a set of attributes, and exhibiting behaviors that indicate adaptability and flexibility in responding to changes in transportation networks, such as rerouting around congested areas or adjusting to changes in public transit schedules. This expertise can also be reflected in the agents' state, such as having a high level of "transportation awareness", indicating their ability to perceive and respond to changes in the transportation environment, and maintaining a dynamic representation of the transportation network, which can be updated based on new information or changes in the environment. Furthermore, the agents' interaction rules can also reflect their expertise in navigating complex transportation networks, such as having rules that govern how they interact with other agents, such as pedestrians, drivers, or public transit vehicles, in order to navigate through shared spaces, and possessing rules that enable them to communicate with other agents, such as sending or receiving information about traffic congestion or road closures. By selecting agents with these characteristics, state, and interaction rules, the platform can adapt their characteristics to respond to a severe tornado event, such as by modifying their route-planning behavior to avoid tornado-affected areas. Certain agents, such as A2, can be deleted for not meeting a predetermined threshold or quota for a particular subpopulation.

The third simulation session 760c can be performed using items (e.g., data, executables, rules, models, and so forth) relating to third state of the world W3. The third instantiated agent population 730c can include agents A3' and A4.

Here, the platform can generate the third instantiated agent population 730c based at least in part on the second instantiated agent population 730b. For example, the platform can generate a subset of agents by performing a crossover operation (e.g., combining aspects of agents A3 and An to generate agent A3'). An input set of agents for performing the crossover operation can include agents whose performance meets or exceeds a predetermined fitness threshold (e.g., an R-squared value, an F1 score), is within a quality range (e.g., top 25% of agents from the first instantiated agent population 730b, top 50% of agents, top N agents), and/or has a particular characteristic (e.g., a particular trait, geography, state, or agent interaction rule). For example, the platform can select agents that have demonstrated expertise in responding to natural disasters, such as hurricanes or wildfires, and combine their characteristics to generate new agents that can effectively respond to a severe tornado event. As another example, the platform can evolve agents in response to changing environmental conditions, such as a sudden change in weather patterns or a natural disaster, by adapting their characteristics, state, and interaction rules to respond to the new conditions.

In some implementations, agent evolution operations can be performed based on experimenter questions and follow-up hypotheses. For example, when an experimenter asks a question such as "How do agents adapt to changes in transportation networks?", the platform can extract tokens from the question to infer meaning, such as identifying the key concepts of "agents", "adaptation", and "transportation networks". The platform can then evolve agents with desired characteristics, such as traits or geography, based on the inferred meaning, such as by selecting agents that have demonstrated expertise in navigating complex transportation networks.

FIG. 7 illustrates agent chaining principles. Here, agent chaining refers to the process of linking multiple agents together. For example, agents can be horizontally chained at various simulation sessions to form instantiated agent populations 730*a*, 730*b*, and 730*c*. In this context, chaining enables the platform to manage local agent interaction rules. For example, local agent interaction rules can specify that a subset of agents in a particular instantiated agent population are supervisor agents, expert agents, data gatherer agents, task executor agents and so forth. These traits can be randomly assigned, assigned to agents with specific traits, assigned based on agent lineage, and so forth. The rules can govern other agents to delegate certain tasks to agents of a particular type. Agents can be vertically chained to preserve agent lineage (e.g., in an agent attribute).

The data (e.g., agent data, context data, state of the world data) can be persisted for sessions (760*a*, 760*b*, 760*c*) and/or contexts to enable explainability and traceability of data, incremental learning of models, and so forth. The data can be persisted using any suitable medium or technique, such as relational databases, NoSQL databases, file systems, cloud storage services, or other data storage solutions. For example, the platform can use a first database to store agent data, such as agent attributes, behaviors, and interactions, and use a second database to store context data, such as simulation session metadata and state of the world data. Additionally, the platform can use data serialization techniques, such as JSON or XML, to store and retrieve data from files or databases. The persisted data can be used to support various use cases, such as auditing and compliance, data analytics and visualization, and model training and validation.

Example Experimenter Accessibility Features

FIGS. 8-14 are example graphical user interfaces (GUIs) illustrating features of the multi-agent simulator platform, according to some arrangements. The GUIs enable experimenter interaction with the platform and allow experimenters to provide inputs, such as questions, questions chains, hypotheses, agent selection, trait selection, virtual world parameters (e.g., external data sources, rules, events, attributes, constraints), and so forth.

Figure 8:
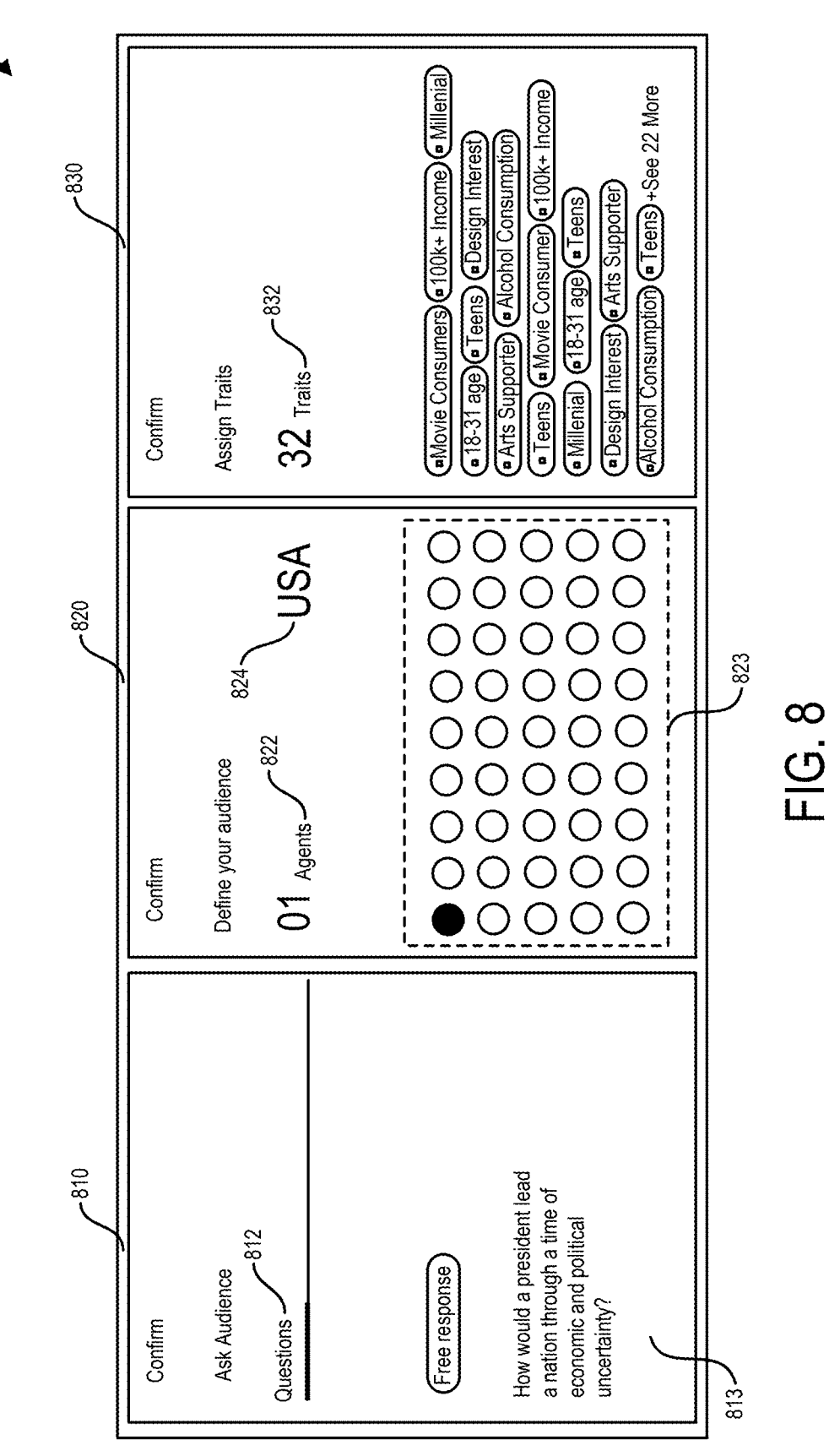
Figure 9:
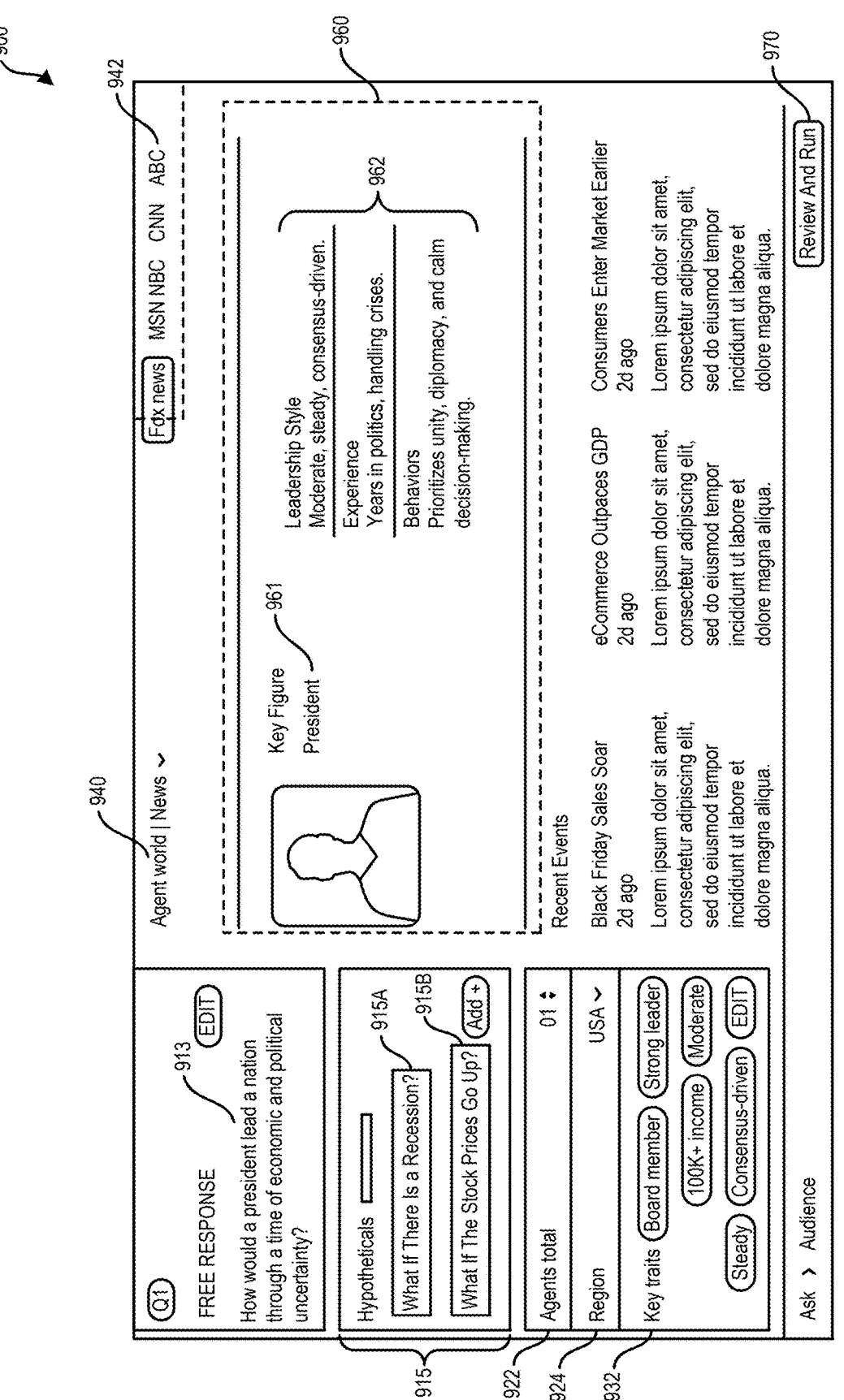

As shown in FIGS. 8 and 9, the platform can generate graphical user interfaces (GUIs) (800, 900) for enabling experimenters to enter or select questions 812. The questions can be entered as free-text input (813, 913) or can be selected from a list of platform-generated hypotheses 915. As shown, the hypothesis set 915 includes a first hypothesis 915*a* and a second hypothesis 915*b*. Experimenters can also add hypotheses, modify hypotheses, chain hypotheses, prioritize hypotheses, filter hypotheses, and so forth. The platform can execute follow-up simulation sessions for hypotheses 915, allowing experimenters to refine and test their hypotheses.

As shown, the GUIs (800, 900) also enable experimenters to provide information sufficient to define parameters for simulations, such as agent 820 parameters (e.g., quantity 822, geography 824, demographics, behavior, preferences). Experimenters can quickly add or remove agents by interacting with the agent selection pane 823. Experimenters can also provide information regarding traits 832, such as personality traits, skills, knowledge, attitudes, and experiences. The traits can be generated using a reference data store accessible to the platform, entered by the users as free text, automatically generated based on the question 812 (e.g., by applying natural language processing (NLP) techniques to tokenize the question and generating a set of relevant traits for answering the question), and so forth.

Upon executing a simulation in a particular session, the platform can generate an output set 960. Output sets can include quantitative and/or qualitative information, such as scores, percentages, predicted values, narratives, images, video, audio, charts, graphs, heatmaps, and so forth. For instance, as shown, the output set 960 includes a predicted entity 961, and predicted entity attributes 962. The output set 960 can also include confidence intervals, uncertainty estimates, and sensitivity analyses.

The experimenter can interact with the GUIs (800, 900) to tune the sets of agents 922, regions 924, and/or traits 932 for subsequent simulation sessions. The experimenter can also explore the agent world 940 (e.g., access rules, events, attributes, and/or constraints). In an example, the GUIs enable the experimenter to access news sources 942, social media feeds, and/or other external data sources. In some implementations, the news sources are reference data utilized by the agents to generate the output set 960. In some implementations, the news sources 942 are supplemental data provided to enable the experimenter to contextualize and validate the output set 960.

Figure 10:
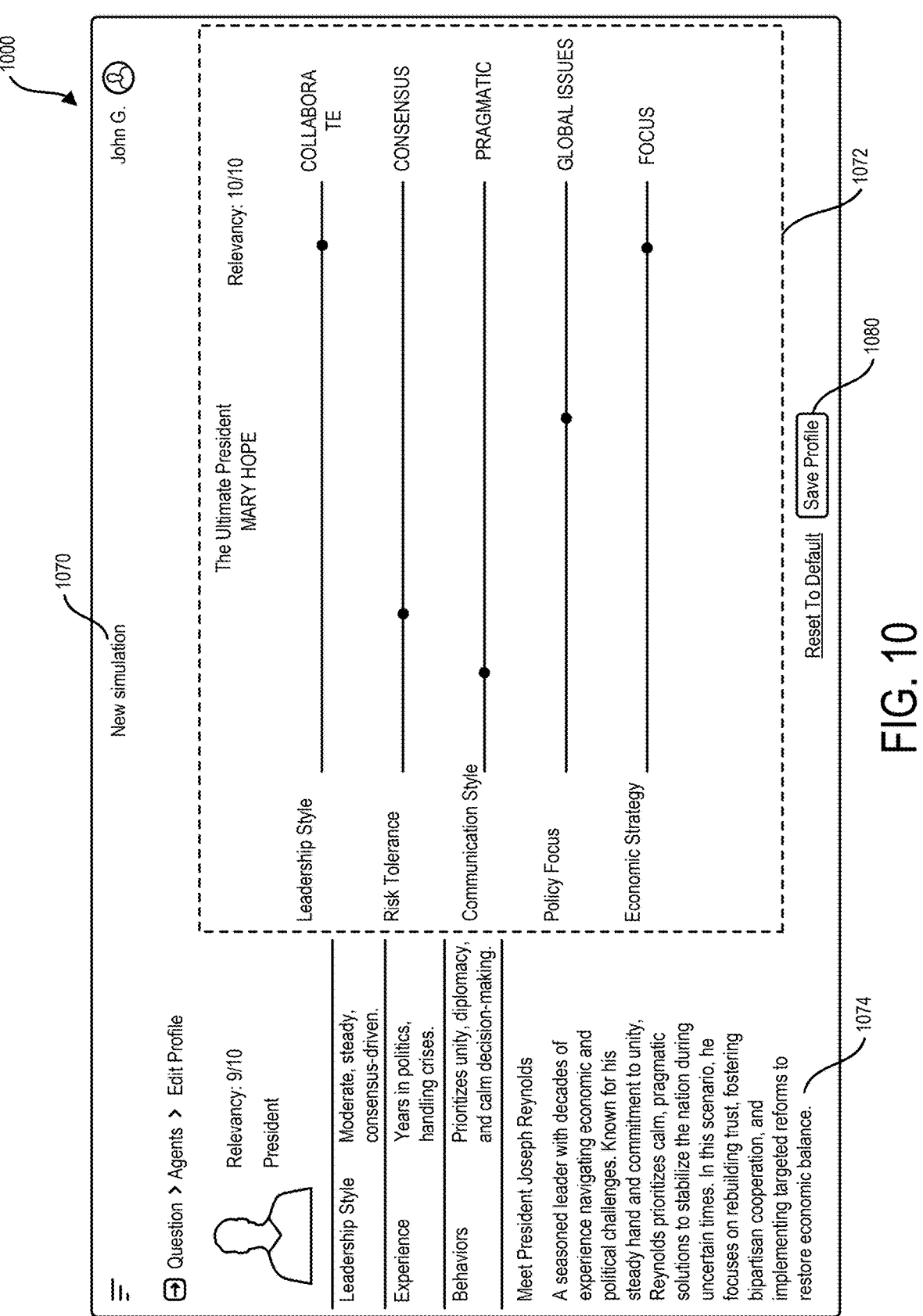

FIG. 10 illustrates an example GUI 1000 for enabling experimenters to more finely tune agent parameters (e.g., to model decision-maker actions or approaches based on particular sets of decision-maker traits). As shown, the simulation 1070 includes a setting tuning window 1072, which enables experimenters to define trait profiles using suitable controls, such as buttons, ranges, sliders, dropdown menus, and so forth. In some implementations, the setting tuning window can be prepopulated based on agent feedback (e.g., based on output sets generated by the agents). As shown, the platform can generate a narrative 1074, which can be generated based on the detected settings provided via the setting tuning window 1072.

Figure 11:
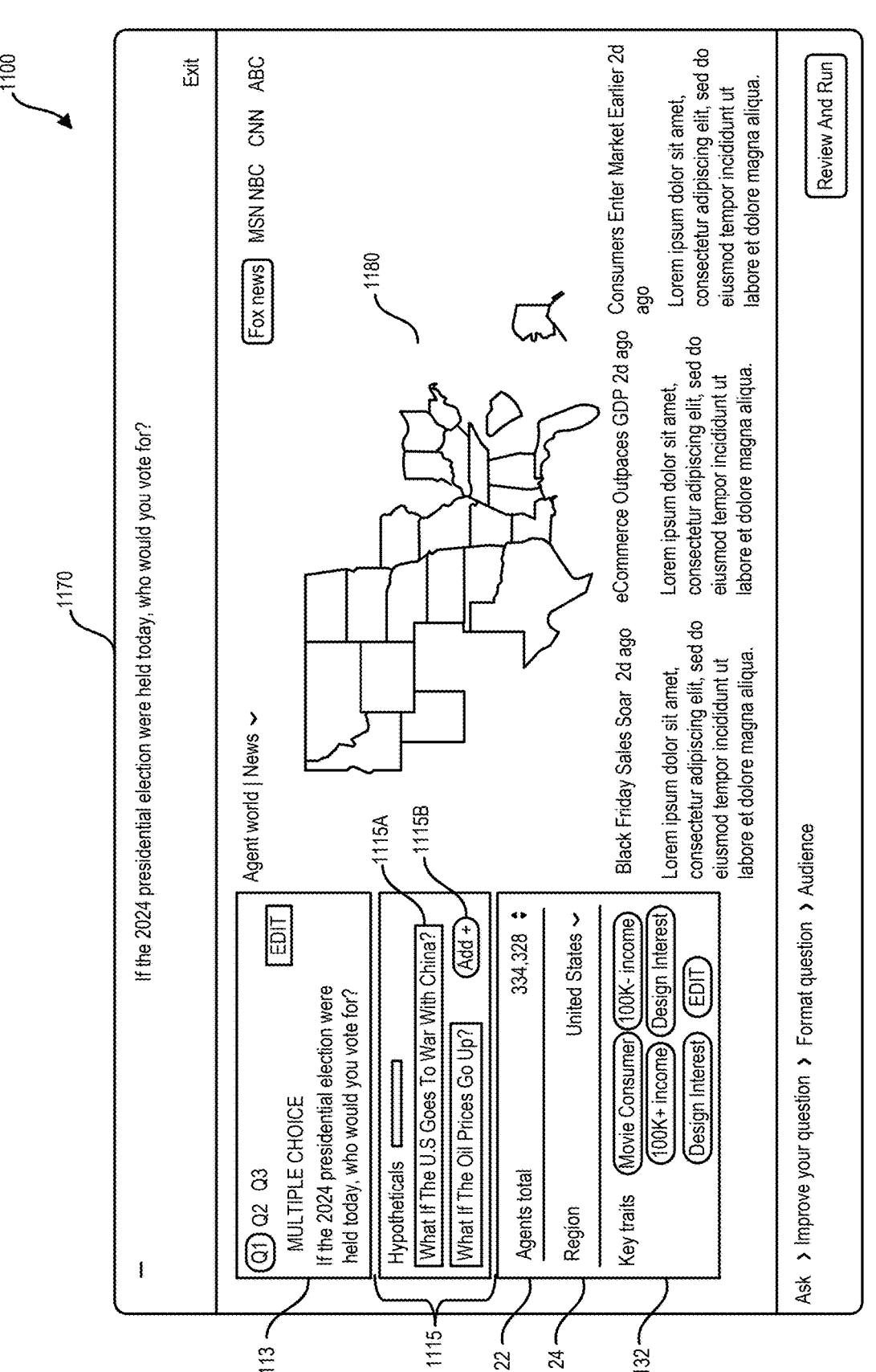

FIG. 11 illustrates an example GUI 1100 for enabling experimenters to access visualized aspects of output sets (e.g., multi-agent output sets aggregated to generate various statistical values, such as frequency counts, median values, summaries, counts, and so forth). As shown, the output set visualization 1180 includes a dynamically generated map constructed for the experimenter-defined region 1124. Based on the question 1113 ("If the 2024 presidential election were held today, who would you vote for?"), 334,328 agents 1122 having traits 1132 are instantiated to generate the predictions. The visualization can also include charts, graphs, heatmaps, and other visualizations to facilitate understanding of the output set.

Figure 12:
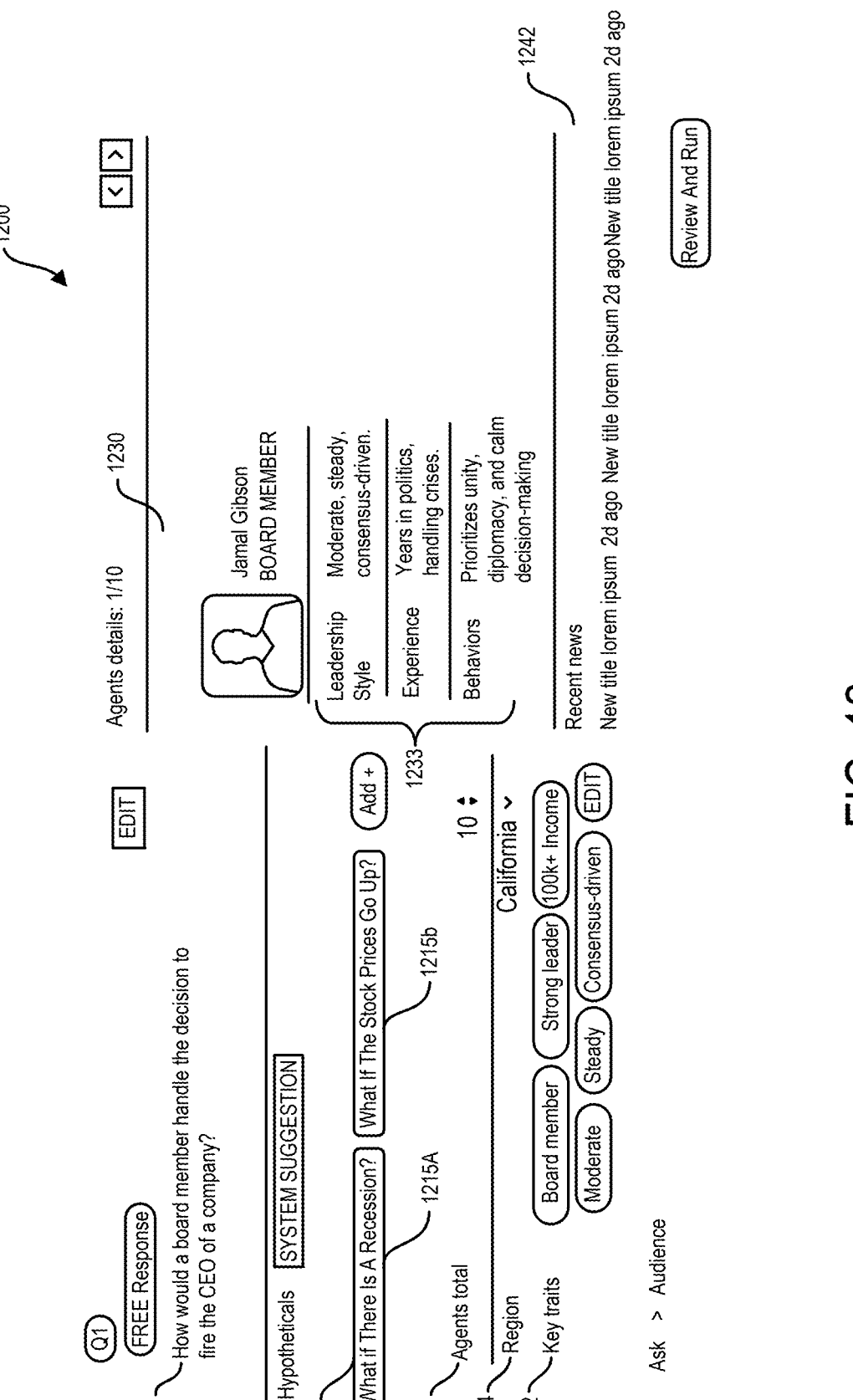

FIG. 12 illustrates an example GUI 1200 for enabling experimenters to model decision-maker actions. As shown, the simulation 1230 includes enables experimenters to define trait profiles 1233 for a set of decision-maker entities (here, the set consists of ten agents 1222). In some implementations, the trait profiles can be automatically generated or modified using publicly available information 1242 (e.g., news sources, regulatory filings, company compliance reports) and/or supplemental information accessible via local repositories, knowledge graphs, and so forth, and experimenters are enabled to further tune the profiles.

Figure 13B:
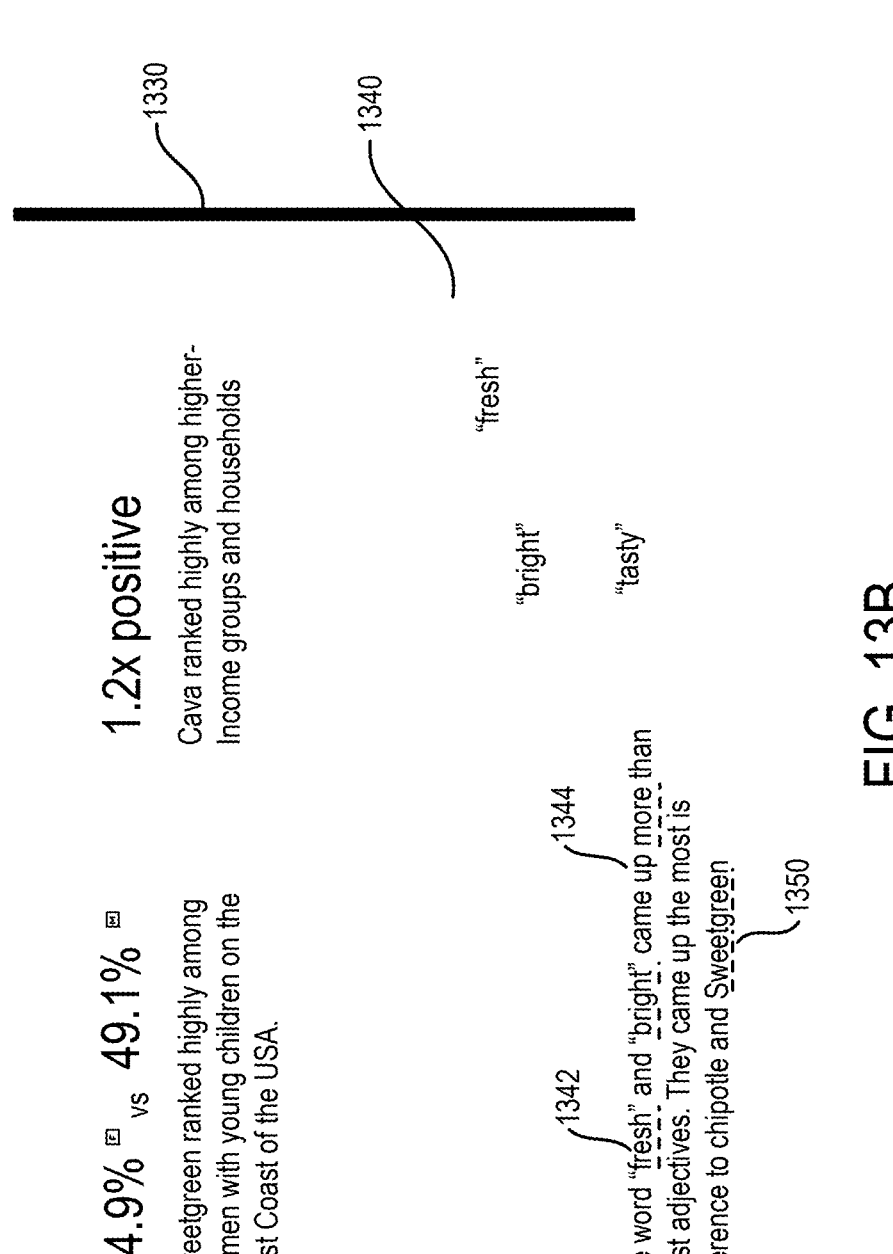

FIGS. 13A and 13B illustrate an example GUI 1300 for providing agent feedback summaries, such as quantitative summaries 1310, qualitative summaries 1320, and composite summaries 1330. The agent feedback regarding particular item 1320 (e.g., a product presented to the agents, an item extracted from the questions) can be included in summaries generated across agent populations or subpopulations (e.g., for a subset of agents in a particular location, with a particular set of traits 1332, and so forth). Quantitative summaries can include metrics (1312*a*, 1312*b*), such as scores, ratings, and statistics. In some implementations, the platform can execute a trained summarization and/or generative model on the agent feedback to produce feedback summary 1314, which can include the item 1320, quantifier 1336*a* (e.g., a categorical value generated based on a correlation to a numerical value or range), and so forth. Qualitative summaries can include text-based feedback, comments, and suggestions and can include extractive summaries of qualitative feedback terms 1336*b*. Composite summaries can include combination of quantitative and qualitative feedback, such as an overall rating accompanied by text-based comments. Composite summaries can further include visualizations 1340, which can show cluster maps, heatmaps, Venn diagrams, or the like. As shown, the size of the cluster components can be proportional to a frequency value (e.g., count, percentage, sum) associated with a particular term (e.g., "bright", "fresh").

FIG. 14 illustrates an example GUI 1400 for enabling experimenters to define question chains by testing targeted hypotheses. As shown, the hypotheses can be automatically generated by the platform in a set that includes an least a predetermined number H of hypotheses (1415*a*, 1415*b*, 1415*c*) for each of a set of categories 1412. The categories 1412 can be retrieved from a data store, retrieved from a knowledge graph, and/or generated by model by accessing external or supplemental data (e.g., news sources, regulatory reports, company filings). In some implementations, the system can automatically select top N categories, top H hypotheses, and so forth. In some implementations, experimenters can tune, ignore, or confirm system recommendations 1420 for the hypotheses.

Example Agent Trait Diffusion Simulation Techniques

Figure 15:
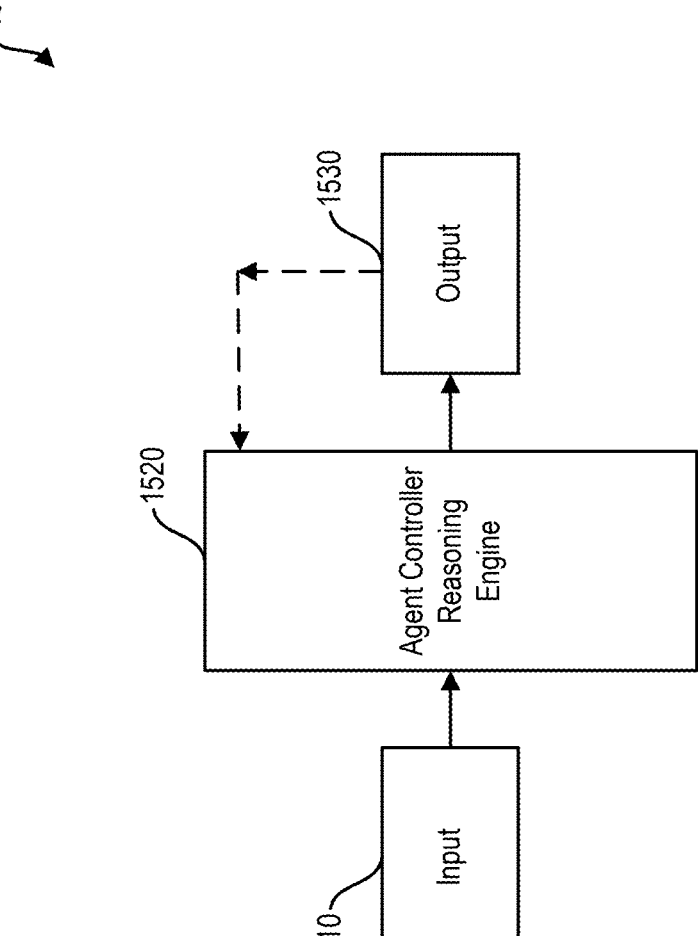
FIG. 15 is a block diagram showing aspects of diffusion simulation techniques, such as agent trait diffusion simula-tion techniques of the multi-agent simulator platform, according to some arrangements.

FIG. 15 is a block diagram 1500 showing aspects of diffusion simulation techniques, such as agent trait diffusion simulation techniques of the multi-agent simulator platform, according to some arrangements. The diffusion simulation techniques can be used to generate trait candidates for agents that have specific trait distributions (e.g., specific distributions of traits across agents in a set of Y agents). For example, the platform can use census data, market research data, or sales data to determine the number of owners of a particular appliance, such as refrigerators, and then instantiate the top Y agents that are likely to be owners of the appliance based on demographic characteristics (e.g., age, income, household size) and behavioral characteristics (e.g., purchasing history, lifestyle). These agents can then be used in a simulated consumer survey to predict responses to marketing campaigns or product launches. In another example, the diffusion simulation techniques can be applied in cybersecurity to model the spread of malware or vulnerabilities across a network. By instantiating agents with traits representing different device configurations, user behaviors, or network topologies, the platform can simulate the diffusion of malware and identify the most vulnerable agents or nodes in the network, allowing for more effective prioritization of patching and mitigation efforts.

Generally, traits relate to characteristics of the entities being evaluated or simulated. For instance, in the context of cybersecurity risk modeling, traits relate to characteristics of threat actors, systems, or vulnerabilities, such as threat actor motivations (e.g., financial gain, espionage, hacktivism), attack vectors (e.g., phishing, ransomware, denial-of-service), system vulnerabilities (e.g., software flaws, configuration errors, human error), incident response strategies (e.g., containment, eradication, recovery), and/or security postures (e.g., patch management, access controls, employee training). Traits can also include characteristics of assets, such as data sensitivity levels, system criticality, or network connectivity. In some implementations, traits comprise demographic traits (e.g., age, gender, occupation, education level), preferences (e.g., hobbies, interests, values), interests (e.g., topics, activities, causes), personality traits (e.g., extraversion, agreeableness, conscientiousness), skills (e.g., language proficiency, technical expertise, problem-solving abilities), knowledge levels (e.g., domain-specific expertise, general knowledge), emotional states (e.g., emotional intelligence, sentiment, mood, impression, risk assessment feedback), social connections (e.g., social networks, relationships, group affiliations), cultural backgrounds (e.g., ethnicity, nationality, socioeconomic status), product preferences, product ownership status, and/or physical or cognitive abilities (e.g., disabilities, health conditions, cognitive impairments).

By incorporating characteristics in various suitable combinations, the platform can deploy agents that exhibit realistic and nuanced behaviors, allowing for more accurate and informative simulations. For instance, trait distributions can follow various statistical distributions, such as normal distributions (e.g., modeling the average price sensitivity of consumers), random distributions (e.g., modeling the unpredictability of consumer preferences), or custom distributions (e.g., modeling the specific characteristics of a particular demographic segment). Traits can be represented as binary values (e.g., owner or non-owner of a product), multivariate values (e.g., different levels of satisfaction with a product), or continuous values (e.g., the likelihood of purchasing a product on a scale of 0 to 1). By generating agents with traits that follow these distributions, the platform can simulate complex and realistic market scenarios, cybersecurity risk scenarios, and so forth, enabling users to better understand and predict consumer behavior, risks, or other complex phenomena.

In some implementations, the platform can generate trait values based on empirical data, market research, or a combination of both. For example, trait values can be based on vulnerability data, market data, survey data, customer reviews, or transactional data. This enables the platform to generate simulations that are informed by real-world data and market insights, while also allowing experimenters to explore hypothetical scenarios and "what-if" analyses. By incorporating these features, the platform provides a powerful tool for users to simulate and analyze complex market dynamics, and develop effective strategies for product development, marketing, and sales. In the context of cybersecurity risk modeling, the platform can generate trait values based on threat intelligence data, incident reports, vulnerability assessments, or penetration testing results. For example, trait values can be based on historical data of previous cyber-attacks, threat actor profiles, or system vulnerability assessments. This enables the platform to generate simulations that are informed by real-world cybersecurity data and risk insights, while also allowing users to explore hypothetical scenarios and "what-if" analyses. By incorporating these features, the platform provides a powerful tool for users to simulate and analyze complex cybersecurity risk scenarios, and develop effective strategies for risk mitigation, incident response, and security posture improvement.

As shown, the process 1500 can include one or more inputs 1510, which can be processed by an agent controller reasoning engine 1520 to generate a set of outputs 1530.

Inputs 1510 can include local and/or external data sources. Local data sources can include virtual world entities and properties (rules, events, attributes, constraints), questions, question chains, agent interaction rules, state data (e.g., state definition data), characteristics, and/or feedback, context properties, or other suitable items previously generated or collected by the platform. External data sources can include third-party information repositories, databases, or services. External data can include various data items, such as cybersecurity threat or vulnerability data, economic data (e.g., from the Bureau of Labor Statistics), such as unemployment rates, or consumer price indices. In some implementations, external data includes news data, such as financial news feeds, political news feeds, market analysis reports, cybersecurity threat data, and social media feed data. In some implementations, external data includes retail data, such as data from retail sales databases (e.g., of prior sales figures from previous years or seasons, transaction volumes, and/or pricing information). In some implementations, external data includes environment data, such as weather-related data (e.g., from weather services that provide environmental conditions). The external data can include census data (e.g., providing demographic distributions). The external data can include regulatory information, such as compliance requirements, legal requirements, and/or policy information. For example, the regulatory information can include information relating to the composition of particular administrative agencies, boards, and/or associated agent information (e.g., to aid in simulation of agents within the virtual world).

The agent controller reasoning engine 1520 can perform operations to generate outputs 1530, including setting and updating context properties, such as virtual world properties, agent properties, and agent interaction rules. For example, the agent controller reasoning engine 1520 can use interpolation techniques to generate values for agent traits or virtual world properties based on existing data (e.g., by making imputations or inferences using real-world statistical data). The engine can use inferencing techniques, such as Bayesian inference or fuzzy logic, to generate new trait values or properties based on existing data and rules. Additionally, the engine can utilize artificial intelligence (AI) and machine learning (ML) models to learn patterns in the data and generate new outputs. For instance, the engine can use ML models to predict consumer behavior or sentiment, cybersecurity risks, and so forth based on historical data and market trends.

The agent controller reasoning engine 1520 can perform self-checks and validation operations to ensure the accuracy and consistency of the outputs 1530. For example, the agent controller reasoning engine 1520 can perform sanity checks on the generated trait values or properties to ensure they fall within expected ranges or distributions. The agent controller reasoning engine 1520 can also use feedback mechanisms, such as user feedback or automated feedback loops, to refine and update the outputs 1530. Furthermore, the agent controller reasoning engine 1520 can use context properties (e.g., additional contextual properties, such as those described in relation to FIG. 16B), such as virtual world rules or agent interaction rules, to constrain and guide the generation of outputs 1530. By applying these techniques, the agent controller reasoning engine 1520 can generate high-quality outputs 1530 that accurately simulate complex cybersecurity risk scenarios, market dynamics and consumer behaviors. The outputs 1530 can include updated agent traits, virtual world properties, and agent interaction rules, which can be used to simulate and analyze various market scenarios and develop effective strategies for product development, marketing, and sales.

Figure 17:
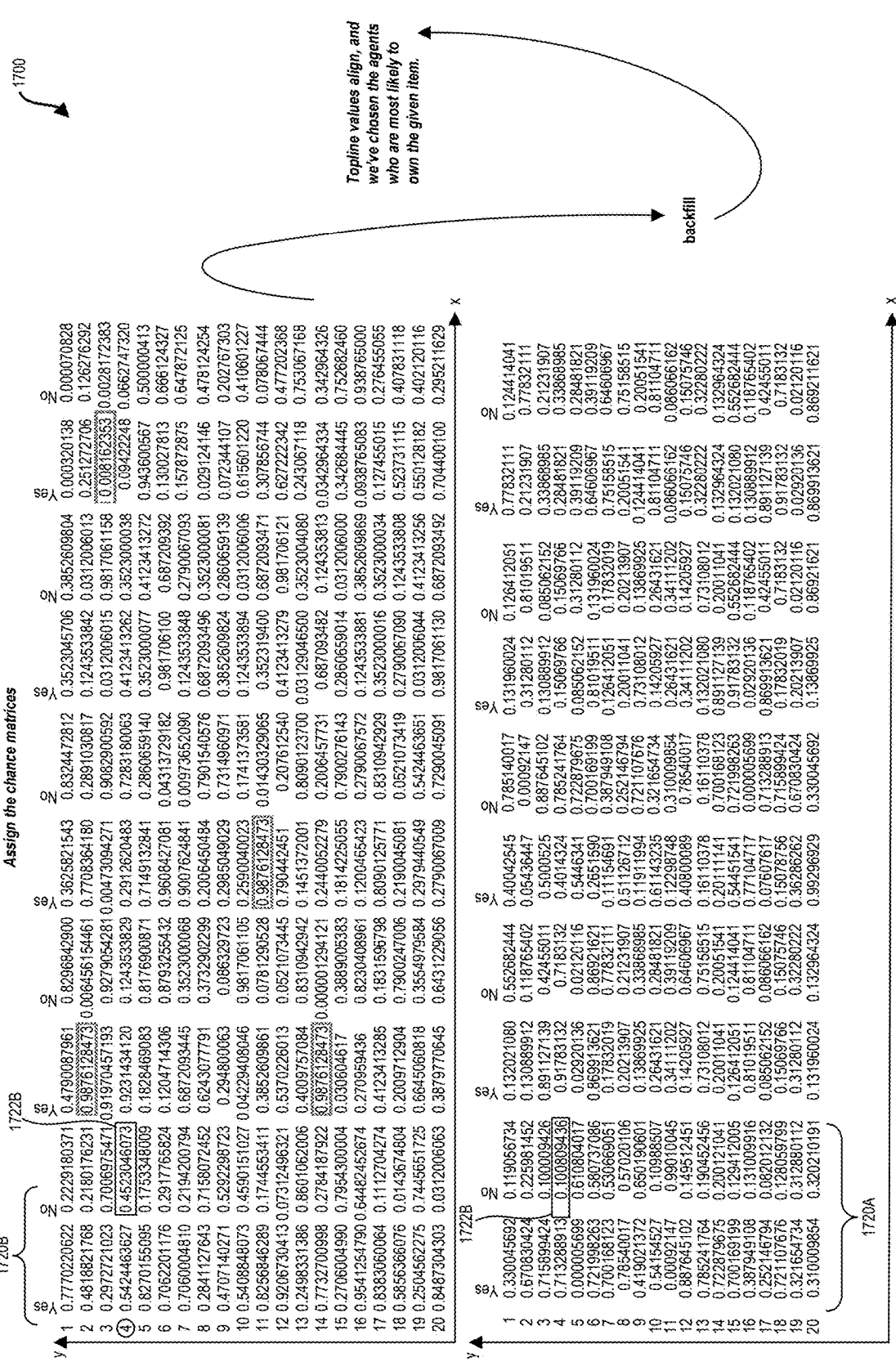
FIG. 17 is a diagram illustrating example output of the reasoning operations of the diffusion simulation techniques, according to some arrangements.

FIGS. 16A and 16B are diagrams illustrating example reasoning operations (1610, 1650) to implement the diffusion simulation techniques, according to some arrangements, and FIG. 17 is a diagram illustrating example output chance matrix 1700 of the reasoning operations of the diffusion simulation techniques, according to some arrangements.

As shown in FIG. 16A, the platform can receive a query 1610, which corresponds to the question entity 620, via a graphical user interface (GUI) or generate it at least in part autonomously. Upon receiving or generating the query, the platform applies reasoning operations 1620 to produce an estimate in response. These reasoning operations can encompass a range of processes, including but not limited to data retrieval, probabilistic modeling, and simulation-based forecasting, leveraging attributes and rules of a virtual world entity 610. The estimate generated can incorporate external data 1622a, which can be associated with metadata 1622b that provides context or additional information about the data. To refine the estimate, the platform can apply tuning operations (1630a, 1630b) by applying additional constraints 618 to the output of the initial reasoning operations 1620. This refinement process enables the platform to generate a more precise output 1640, which can include an output value 1642a and/or an output constraint value set 1642b. The output value 1642a can be represented as a point estimate, a range of values, or a distribution, depending on the nature of the query and the specific implementation of the platform.

As shown in FIG. 16B, the platform can utilize chain-of-thought reasoning operations to receive or generate an additional query 1660 based on the output value set 1642a and/or output constraint value set 1642b, creating a question chain 622 that reflects the evolving nature of the inquiry. Chain-of-thought reasoning involves a series of logically connected queries or reasoning steps, where each step builds upon the output of the previous one. These queries can be dynamically linked using context identifiers, session identifiers 660, simulation identifiers, or similar mechanisms to create a question chain. The platform can then perform additional reasoning operations 1670, which can involve model-based operations such as predictive modeling or simulation, to generate further output 1680. This additional output can include an additional output value 1682a and/or an additional output constraint value set 1682b, which can be represented in various formats similar to the initial output.

As illustrated in FIG. 17, the platform can leverage the additional output value 1682a and/or output constraint value set 1682b as parameters for parametric modeling operations to instantiate agents 630 with specific traits 632 in a simulation. For instance, the additional output value 1682a can indicate the probability of a particular trait occurring given a specific constraint 618 or agent interaction rule 638. Using these parameters, the platform can iterate to instantiate Y agents, each endowed with particular traits 1720a, as shown on the chance matrix 1700. Traits can be represented in binary (e.g., owning or not owning a product), multivariate (e.g., different satisfaction levels with a product), or continuous values (e.g., likelihood of purchasing a product on a scale). The platform can then select for instantiation agents Y' that exhibit traits with the top values 1722b for each iteration, based on criteria such as the top N or top N % of trait values, considering agent feedback items 636a and 636b.

Example Use Cases

FIG. 18 is an example flowchart 1800 showing operations of the multi-agent simulator platform, according to some arrangements. Operations can be instrumental to implement techniques for simulating a virtual world in a multi-agent simulator.

The operations can include generating, at 1810, a virtual world including a set of agents. A first agent in the set of agents can have a one or more agent traits and a set of local interaction rules. The local interaction rules can use symbolic logic, can be implemented by a first trained machine learning model, and so forth.

In some implementations, the operations can include generating a set of predicted entity attributes, displaying the set of predicted entity attributes via the GUI, and causing the GUI to enable selection of entity attributes from the set of predicted entity attributes to populate the one or more agent traits.

In some implementations, the operations can include defining a set of agent subpopulations, assigning a particular local agent interaction rule to a particular agent subpopulation in the set of agent subpopulations, wherein the particular local agent interaction rule includes a model selection logic for selecting a particular first trained machine learning model, and instantiating subset of agents corresponding to a particular agent subpopulation.

The operations can include receiving, at 1820, input including a question and a set of input traits. The input can include experimenter input, which can be entered, uploaded or otherwise acquired via a graphical user interface (GUI) of a computing device, platform-generated input (e.g., output of AI models provided by or accessible to the platform), data retrieved from memory, or a combination thereof.

The operations can include instantiating, at 1830, the set of agents using the set of input traits. In some implementations, the operations can include calibrating the set of agents to match statistical distributions of real-world data and executing a calibration engine to generate the one or more agent traits.

The operations can include executing, at 1840, a first simulation session by causing the set of agents to generate a first output set. In some implementations, the operations can include generating training data using a subset of the first output set by applying gating logic a portion of the first output set generated by a particular first agent in the set of agents, executing a federated learning function to incrementally train a particular first model for the particular first agent using (i) the training data and (ii) reference feedback, and aggregating model updates from the particular first model and a particular second model associated with a particular second agent in the set of agents to enable incremental learning of a foundation model for the particular first model and the particular second model, wherein a gated portion of the first output set is not utilized in incremental learning of the foundation model.

The operations can include accessing, at 1850, an additional data source to generate world characteristics including one or more of an environmental condition and a temporal condition. In some implementations, accessing the additional data source further includes retrieving external data, including one or more of a company report, a news article, a social media feed, and a document, updating the virtual world by incorporating the retrieved external data, and executing an updated simulation session using the updated virtual world. In some implementations, the operations can include accessing a knowledge graph to retrieve additional data, incorporating the retrieved additional data into a simulation by updating at least one of virtual world properties or agent properties, and executing an updated simulation session using the updated virtual world.

The operations can include using, at 1860, the world characteristics to determine agent evolution logic by, for example, by items (e.g., data, executables, rules, models, and so forth) relating to the second state of the world to detect temporal conditions, environmental conditions, and/ or other conditions. Such conditions can be raised, for example, by changes in world properties based on the additional data.

The operations can include evolving, at 1870, the set of agents according to the agent evolution logic by performing at least one of mutation of agent traits, selection of agents, crossover of agent characteristics, or deletion of agents that do not meet a fitness threshold. In some implementations, evolving the set of agents further includes conditionally instantiating a second set of agents based on the world characteristics, including detecting a change in the virtual world, evaluating a conditional agent instantiation rule based on the detected change, in response to determining that the conditional agent instantiation rule is met, instantiating a new agent in the virtual world, and integrating the new agent into the evolved set of agents prior to executing the second simulation session.

The operations can include executing, at 1880, a second simulation session using an evolved set of agents to generate a second output set. In some implementations, the operations can include using the question and additional data from the additional data source to generate a set of hypotheses to include in a question chain including the question, and executing a particular simulation session for each hypothesis in the set of hypotheses.

The operations can include displaying, at 1890, at least a portion of the first output set and second output set at the GUI. In some implementations, the operations can include generating a visualization of the first output set, displaying the visualization via the GUI, and causing the GUI to enable an experimenter to interact with the visualization to refine a simulation by updating one or more of questions, virtual world characteristics, or agent characteristics. Additionally, the operations can include generating a narrative based on at least one of the first output set or the second output set, displaying the narrative via the GUI, and causing the GUI to enable interaction with the narrative to refine a simulation.

In some implementations, the operations can include persisting agent feedback, the agent feedback including at least one of the first output set or the second output set, in memory, wherein the memory includes a first memory location allocated to the first output set and a second memory location allocated to the second output set, generating an agent feedback summary by aggregating the persisted agent feedback, including calculating a set of metrics and generating a narrative, displaying the agent feedback summary via the GUI, receiving additional experimenter input, and using the additional experimenter input to refine a simulation.

In some implementations, the operations can include performing sentiment analysis on agent feedback, the agent feedback including at least one of the first output set or the second output set, including tokenizing the agent feedback into a set of items, applying a sentiment analysis model to generate a sentiment token based on the set of items, generating a sentiment summary based on the sentiment token, and providing the sentiment summary to an experimenter.

Figure 19:
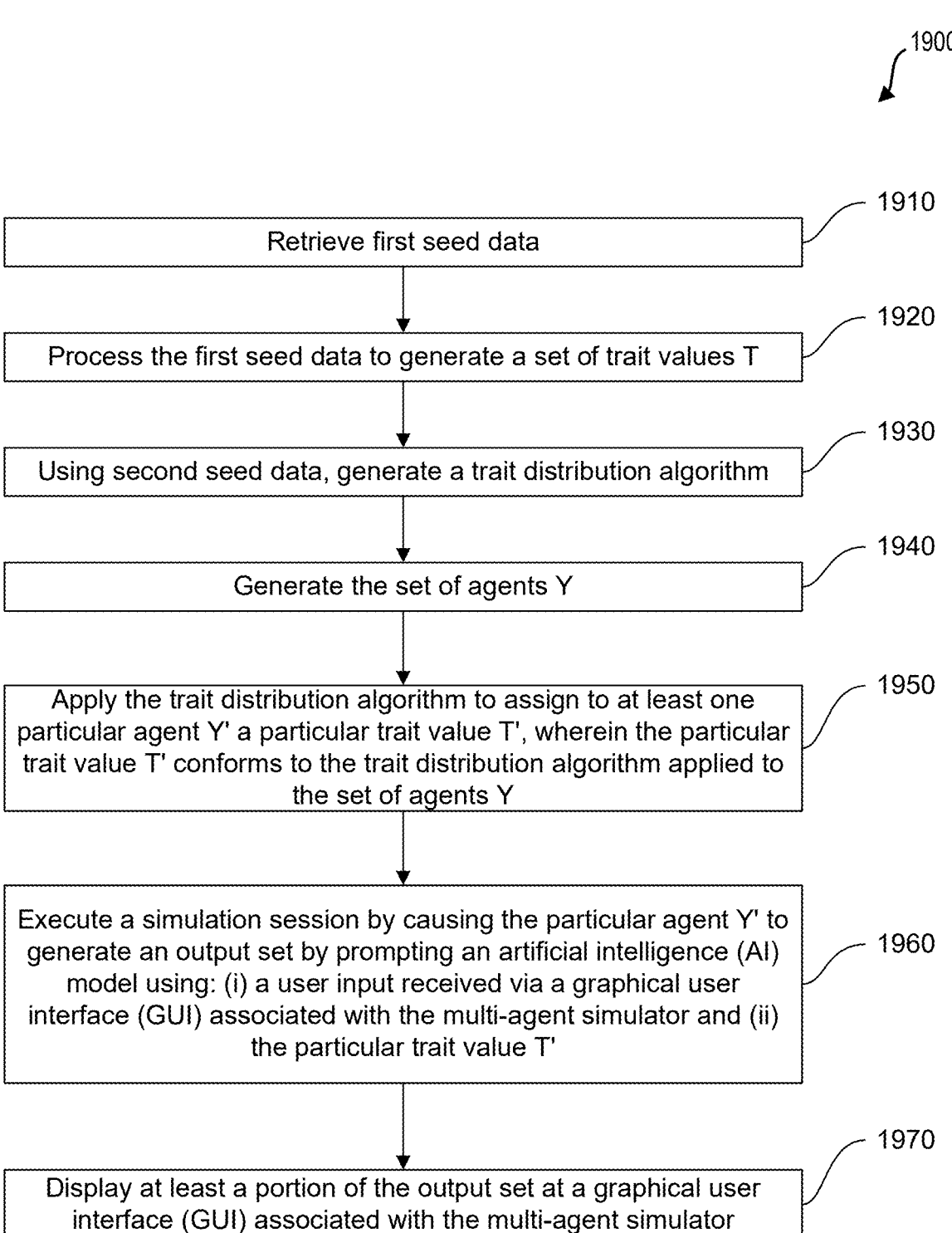
FIG. 19 is an example flowchart showing agent trait diffusion operations of the multi-agent simulator platform, according to some arrangements.

FIG. 19 is an example flowchart showing agent trait diffusion operations 1900 of the multi-agent simulator platform, according to some arrangements.

Operations 1900 can include generating a trait distribution for a set of agents Y. For example, at 1910, in response to a query, the platform can retrieve first seed data, such as contextual data relating to news, regulatory reports, cybersecurity threat reports, and so forth. In a cybersecurity context, the platform can retrieve data related to phishing attacks, ransomware threats, and Denial of Service (DOS) attacks. At 1920, the platform can process the first seed data to generate a set of trait values T. For instance, the platform can generate trait values related to an organization's cybersecurity posture, such as low security awareness, moderate security measures, and high security protocols. The platform can use a Normal distribution (Gaussian distribution) parameterized by mean ($\mu$) and standard deviation ($\sigma$) to model the trait distribution. For example, the platform can generate a distribution for the cybersecurity postures, where the mean ($\mu$) represents the average security posture and the standard deviation ($\sigma$) represents the variability in security postures among organizations.

At 1940, the platform can generate the set of agents Y. For instance, the platform can generate 100 simulated organizations with varying cybersecurity postures. The organizations can be assigned trait values based on the generated distribution, such as 30 organizations with low security awareness, 40 organizations with moderate security measures, and 30 organizations with high security protocols.

At 1950, the platform can apply the trait distribution algorithm to assign to at least one particular agent Y' a particular trait value T', wherein the particular trait value T' conforms to the trait distribution algorithm applied to the set of agents Y. For example, the platform can assign a particular organization Y' a trait value T' of "Moderate security measures" based on the normal distribution.

At 1960, the platform can execute a simulation session by causing the particular agent Y' to generate an output set. For instance, the platform can prompt an artificial intelligence (AI) model using: (i) a user input received via a graphical user interface (GUI) associated with the multi-agent simulator and (ii) the particular trait value T'. In the cybersecurity example, the AI model can generate an output set predicting the likelihood of a successful phishing attack on the organization with moderate security measures.

At 1970, the platform can display at least a portion of the output set at a graphical user interface (GUI) associated with the multi-agent simulator.

In some aspects, the operations can further include processing the first seed data to generate a set of trait parameters P; and using the set of trait parameters P, causing an artificial intelligence model to generate the set of trait values T.

In some aspects, the set of trait parameters P includes one or more of boundary values, weighting functions, or scaling functions. For example, the platform can define boundary values such as min=0 and max=100 for security posture scores. The platform can also define weighting functions, such as w1*(security awareness)+w2*(security measures), or scaling functions, such as scaling security posture scores to a range of 0-1. The operations can further include causing the artificial intelligence model to generate the set of trait values T by applying the trait parameters P to an item generated using the first seed data. For instance, the platform can apply a weighting function to derive a security posture score for each organization.

In some aspects, the item generated using the first seed data includes at least a portion of the first seed data or is derived using the at least a portion of the first seed data. For example, using AI, the platform can analyze news articles to derive a sentiment score for each organization's security posture.

In some aspects, the operations can further include determining a set of values using the first seed data; processing a user input, received via the GUI, to generate the second seed data; and generating a set of synthetic trait values using the set of values in combination with the second seed data. For instance, based on additional seed data, the platform can generate more nuanced options for cybersecurity postures, such as low security awareness with inadequate training, moderate security measures with regular updates, high security protocols with incident response plan, and so forth.

In some aspects, the operations can further include in response to detecting an additional user interaction, via the GUI, with the at least a portion of the output set displayed at the GUI, causing the GUI to display the particular trait value T'.

In some aspects, the operations can further include identifying a subset of agents Y″ from the set of agents Y, wherein each agent in the subset of agents Y″ shares the particular trait value T'; executing a simulation session for each agent in the subset of agents Y″ to generate a respective output set; displaying, at the GUI, side-by-side outputs of respective output sets generated by agents in the subset of agents Y″, wherein the side-by-side outputs enable comparison of outputs generated by agents that share the particular trait value T'.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed or implemented in parallel, or may be performed at different times. Further, any specific numbers noted herein are only examples: alternative embodiments may employ differing values or ranges.

The teachings of the technology provided herein can be applied to other systems, not necessarily the system described above. The elements and acts of the various examples described above can be combined to provide further embodiments of the technology. Some alternative embodiments of the technology may include not only additional elements to those embodiments noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, specific terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for," but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

We claim:

1. A computer-implemented method for agent instantiation and calibration in a virtual world generated by a multi-agent simulator computing system, the method comprising dynamically evolving agents in linked simulations of network navigation events by:

instantiating a set of agents using a set of input traits, comprising:

allocating a memory associated with the multi-agent simulator computing system, and associating each agent with: (i) at least one skill that corresponds to the set of input traits, (ii) an interaction rule set associating the each agent with a set of selectable artificial intelligence models, and (iii) an agent state;

executing a first simulation session in a simulation by causing the set of agents to generate a first output set by invoking a first set of selectable artificial intelligence models, the first output set comprising predicted network navigation information;

executing a context manager to cause a change event in the virtual world, wherein the change event comprises additional network congestion information for the network;

based on the change event, causing a trained model to generate an evolution operation recommendation;

generating an evolved set of agents by performing one or more recommended evolution operations comprising, for the each agent in the set of agents:

updating a particular agent state by assigning a fitness value to a particular agent skill, wherein the particular agent skill corresponds to particular predicted network navigation information generated by the agent, and wherein the fitness value is based on an evaluation of the predicted network navigation information against reference information; and comparing the fitness value to a fitness threshold N to select a subset of agents having a fitness value of the particular agent skill satisfy the fitness threshold N;

using the subset of agents, generating an evolved set of agents by performing one or more recommended evolution operations comprising a mutation of agent traits to instantiate additional agents having the particular agent skill and corresponding interaction rule set;

maintaining a dynamic representation of the network in the simulation by persisting at least a portion of the predicted network navigation information and the particular agent state in a memory associated with the multi-agent simulator computing system;

using the evolved set of agents and the persisted predicted network navigation information, executing a second simulation session in the simulation to generate a second output set comprising additional predicted network navigation information by causing the evolved set of agents to invoke, according to the corresponding interaction rule set, a second set of selectable artificial intelligence models, wherein the second set of selectable artificial intelligence models is different at least in part from the first set of selectable artificial intelligence models; and displaying at least a portion of the persisted first output set and second output set at a graphical user interface associated with the multi-agent simulator computing system.

2. The method of claim 1, wherein the second simulation session is responsive to the change event that relates to one or more of (1) an environmental condition or (2) a temporal condition.

3. The method of claim 1, further comprising:

responsive to the change event, generating a second subset of agents from the set of agents, wherein an agent in the second subset of agents has a particular geography, state, or agent interaction rule that corresponds to the change event.

4. The method of claim 1, further comprising performing a crossover of agent traits, responsive to the change event, by:

generating the subset of agents from the set of agents, wherein agents in the subset of agents have a first trait;

generating a second trait based on the change event;

instantiating the additional set of agents having the second trait; and combining the subset of agents and the additional set of agents to generate the evolved set of agents.

5. The method of claim 1, wherein the one or more recommended evolution operations include agent deletion, responsive to the change event, by:

based on the fitness threshold N, forgoing inclusion of a second subset of agents in the evolved set of agents.

6. The method of claim 1, further comprising causing an agent in the evolved set of agents to use a particular artificial intelligence (AI) model to generate the second output set, wherein the particular AI model is selected based on an output attribute correlated to the change event, the output attribute comprising at least a portion of the predicted network navigation information.

7. A computer-readable non-transitory storage medium having computer-executable instructions stored thereon that, when executed by at least one processor of a multi-agent simulator computing system, cause the multi-agent simulator computing system to perform computer-implemented operations for agent instantiation and calibration in a virtual world, the operations comprising dynamically evolving agents in linked simulations of network navigation events by:

instantiating a set of agents using a set of input traits, comprising:

allocating a memory associated with the multi-agent simulator computing system, and associating each agent with: (i) at least one skill that corresponds to the set of input traits, (ii) an interaction rule set associating the each agent with a set of selectable artificial intelligence models, and (iii) an agent state;

executing a first simulation session in a simulation by causing the set of agents to generate a first output set by invoking a first set of selectable artificial intelligence models, the first output set comprising predicted network navigation information;

executing a context manager to cause a change event in the virtual world, wherein the change event comprises additional network congestion information for the network;

based on the change event, causing a trained model to generate an evolution operation recommendation, comprising, for the each agent in the set of agents:

updating a particular agent state by assigning a fitness value to a particular agent skill, wherein the particular agent skill corresponds to particular predicted network navigation information generated by the agent, and wherein the fitness value is based on an evaluation of the network navigation information against reference information; and comparing the fitness value to a fitness threshold N to select a subset of agents having a fitness value of the particular agent skill satisfies the fitness threshold N;

using the subset of agents, generating an evolved set of agents by performing one or more recommended evolution operations comprising a mutation of agent traits to instantiate additional agents having the particular agent skill and corresponding interaction rule set;

maintaining a dynamic representation of the network in the simulation by persisting at least a portion of the predicted network navigation information and the particular agent state in a memory associated with the multi-agent simulator computing system;

using the evolved set of agents and the persisted predicted network navigation information, executing a second simulation session in the simulation to generate a second output set comprising additional predicted network navigation information by causing the evolved set of agents to invoke, according to the corresponding interaction rule set, a second set of selectable artificial intelligence models, wherein the second set of selectable artificial intelligence models is different at least in part from the first set of selectable artificial intelligence models; and displaying at least a portion of the persisted first output set and second output set at a graphical user interface associated with the multi-agent simulator computing system.

8. The computer-readable non-transitory storage medium of claim 7, wherein the second simulation session is responsive to the change event that relates to one or more of (1) an environmental condition or (2) a temporal condition.

9. The computer-readable non-transitory storage medium of claim 7, the operations further comprising:

responsive to the change event, generating a second subset of agents from the set of agents, wherein an agent in the second subset of agents has a particular geography, state, or agent interaction rule that corresponds to the change event.

10. The computer-readable non-transitory storage medium of claim 7, the operations further comprising performing a crossover of agent traits, responsive to the change event, by:

generating the subset of agents from the set of agents, wherein agents in the subset of agents have a first trait;

generating a second trait based on the change event;

instantiating an additional set of agents having the second trait; and combining the subset of agents and the additional set of agents to generate the evolved set of agents.

11. The computer-readable non-transitory storage medium of claim 7, wherein the one or more recommended evolution operations include agent deletion, responsive to the change event, by:

based on the fitness threshold N, forgoing inclusion of a second subset of agents in the evolved set of agents.

12. The computer-readable non-transitory storage medium of claim 7, the operations further comprising causing an agent in the evolved set of agents to use a particular artificial intelligence (AI) model to generate the second output set, wherein the particular AI model is selected based on an output attribute correlated to the change event, the output attribute comprising at least a portion of the predicted network navigation information.

13. The computer-readable non-transitory storage medium of claim 7, the operations further comprising generating data for knowledge propagation from local agent models to foundation models by:

using persisted state information for the subset of agents, gating a set of AI models corresponding to a training subset of agents by:

applying a second fitness value to a second fitness threshold N to generate the training subset of agents wherein the second fitness value of the particular agent skill satisfies the second fitness threshold N; and causing at least one foundation model corresponding to the set of identified AI models to be trained using a portion of the persisted state information corresponding to the training subset of agents, wherein causing the at least one foundation model to be trained causes the at least one foundation model to update a set of weights, activation functions, or nodes based on the persisted state information.

14. The computer-readable non-transitory storage medium of claim 7, wherein the predicted network navigation information further comprises one or more of a transportation mode, a transportation route, or a transportation schedule.

15. The computer-readable non-transitory storage medium of claim 7, the operations further comprising enabling agent evolution traceability by chaining a particular first agent in the set of agents with a particular second agent in the evolved set of agents, wherein the particular second agent is an evolved version of the particular first agent.

16. A multi-agent simulator computing system having at least one processor and at least one memory having computer-executable instructions stored thereon that, when executed by the at least one processor, cause the multi-agent simulator computing system to perform computer-implemented operations for agent instantiation and calibration in a virtual world, the operations comprising dynamically evolving agents in linked simulations of network navigation events by carrying out computer-based logic to:

instantiate a set of agents using a set of input traits, comprising carrying out computer-based logic to:

allocate a memory associated with the multi-agent simulator computing system, and associate each agent with: (i) at least one skill that corresponds to the set of input traits, (ii) an interaction rule set associating the each agent with a set of selectable artificial intelligence models, and (iii) an agent state;

execute a first simulation session in a simulation by causing the set of agents to generate a first output set by invoking a first set of selectable artificial intelligence models, the first output set comprising predicted network navigation information;

execute a context manager to cause a change event in the virtual world, wherein the change event comprises additional network congestion information for the network;

based on the change event, cause a trained model to generate an evolution operation recommendation, comprising, for the each agent in the set of agents, carrying out computer-based logic to:

update a particular agent state by assigning a fitness value to a particular agent skill, wherein the particular agent skill corresponds to particular predicted network navigation information generated by the agent, and wherein the fitness value is based on an evaluation of the predicted network navigation information against reference information; and compare the fitness value to a fitness threshold N to select a subset of agents having a fitness value of the particular agent skill satisfies the fitness threshold N;

maintain a dynamic representation of the network in the simulation by persisting at least a portion of the predicted network navigation information and the particular agent state in a memory associated with the multi-agent simulator computing system;

using the evolved set of agents and the persisted predicted network navigation information, execute a second simulation session in the simulation to generate a second output set comprising additional predicted network navigation information by causing the evolved set of agents to invoke, according to the corresponding interaction rule set, a second set of selectable artificial intelligence models, wherein the second set of selectable artificial intelligence models is different at least in part from the first set of selectable artificial intelligence models; and display at least a portion of the persisted first output set and second output set at a graphical user interface associated with the multi-agent simulator computing system.

17. The multi-agent simulator computing system of claim 16, wherein the second simulation session is responsive to the change event that relates to one or more of (1) an environmental condition or (2) a temporal condition.

18. The multi-agent simulator computing system of claim 16, the operations further comprising carrying out computer-based logic to, responsive to the change event:

generate a second subset of agents from the set of agents, wherein an agent in the second subset of agents has a particular trait, geography, state, or agent interaction rule that corresponds to the change event.

19. The multi-agent simulator computing system of claim 16, the operations further comprising performing a crossover of agent traits comprising carrying out computer-based logic to, responsive to the change event:

generate the subset of agents from the set of agents, wherein agents in the subset of agents have a first trait;

generate a second trait based on the change event;

instantiate an additional set of agents having the second trait; and combine the subset of agents and the additional set of agents to generate the evolved set of agents.

20. The multi-agent simulator computing system of claim 16, wherein the one or more recommended evolution operations include agent deletion comprising carrying out computer-based logic to, responsive to the change event:

based on the fitness threshold N, forgo inclusion of a second subset of agents in the evolved set of agents.

* * * * *